(12) United States Patent
Huang et al.

(10) Patent No.: US 7,342,419 B2
(45) Date of Patent: Mar. 11, 2008

(54) BIDIRECTIONAL CURRENT-MODE TRANSCEIVER

(75) Inventors: Hong-Yi Huang, Taipei (TW);
Ching-Chieh Wu, Taipei (TW);
Yuan-Hua Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 77 days.

(21) Appl. No.: 11/442,302

(22) Filed: May 30, 2006

(65) Prior Publication Data

US 2007/0132483 A1 Jun. 14, 2007

(30) Foreign Application Priority Data

Dec. 9, 2005 (TW) .............................. 94143651 A

(51) Int. Cl.
*H03K 19/0175* (2006.01)
(52) U.S. Cl. .............................. 326/83; 326/86; 326/30

(58) Field of Classification Search .................. 326/82, 326/83, 86, 87, 30; 327/108, 109
See application file for complete search history.

(56) References Cited

U.S. PATENT DOCUMENTS

| | | | | |
|---|---|---|---|---|
| 5,220,211 A | * | 6/1993 | Christopher et al. | .......... 326/90 |
| 5,504,782 A | * | 4/1996 | Campbell, Jr. | .............. 375/259 |
| 6,433,579 B1 | * | 8/2002 | Wang et al. | .................. 326/38 |

* cited by examiner

*Primary Examiner*—James H. Cho
(74) *Attorney, Agent, or Firm*—Harness, Dickey & Pierce, P.L.C.

(57) ABSTRACT

A bidirectional current-mode transceiver is provided for improving transmission rates on a transmission line in a manner of current signal transmission, and for reducing the swing of the voltage signal on the transmission line by using a termination resistor, thus improving operating speed. Therefore, the provided transceiver can be applied to a long transmission line.

23 Claims, 26 Drawing Sheets

BIDIRECTIONAL CURRENT-MODE TRANSCEIVER

CROSS-REFERENCE TO RELATED APPLICATIONS

This non-provisional application claims priority under 35 U.S.C. § 119(a) on Patent Application No(s). 094143651 filed in Taiwan, R.O.C. on Dec. 9, 2005, the entire contents of which are hereby incorporated by reference.

BACKGROUND OF THE INVENTION

1. Field of Invention

The present invention relates to a bidirectional signal transmission circuit device, and more particularly to a bidirectional current-mode transceiver for improving transmission rates on a transmission line in a manner of current signal transmission.

2. Related Art

In the design of a very-large-scale integrated circuit VLSI, the main factors causing time delay are two kinds, in which one case relates to a logic gate causing the time delay and the other relates to a transmission line causing the delay time. In general, the delay of the logic gate is the major factor that causes time delay. However, due to progress in VLSI processes and the trend of system-on-chip SOC integration, the logic gate delay is reduced along with the scale down of the dimension of device. While the transmission line inside the IC is prolonged with the enlargement of the IC. The progress in the process and the narrowing of the line width of the interconnect cause a greater transmission line delay, thus the delay time of the whole chip is under control of the transmission line delay. Besides, with the increase of the system clock, the delay caused by the transmission line will be greater than that caused by the logic gate.

The reason for the delay caused by the transmission line lies in the effect of the resistance R and capacitance C parasitized on the transmission line delay time=R×C. For the cross-section of the transmission line, the progress in the process at present relates to significantly scaling down the dimension along the horizontal axis only, and according to this process, only slight alterations can be made along the perpendicular dimension. Besides, with the reduction of the distance between the line width of the transmission line and the interconnect, the length-width proportion of the cross-section of the transmission line is increased, and the parasitic resistance on the transmission line cannot be avoided. Moreover, the reduction in the distance between transmission lines may also cause an increase of an adjacent capacitance and a side capacitance.

The method for improving the delay caused by transmission line in conventional technologies can be divided into improvement of the process and improvement by using circuit techniques. For the process, copper processing and low dielectric constant processing are employed to improve the actual resistance and capacitance of the interconnect. For the circuit techniques, buffers are added in the interconnect, and receiving units are added at the terminal of the transmission line to reduce the time delay caused by the transmission line, thereby reducing the transmission line delay.

Then, along with the continuous progress in the process, the area of the chip is reduced, but the package technology of the chip is not improved proportionally. Therefore, the number of the input/output pins and the ratio of the input/output bandwidth required by the whole chip are slightly increased. As a result, each pin should have a large bandwidth to meet the requirement of the signal transmission in the chip. Conventional signal transmission methods include a single-ended signal transmission and a bidirectional signal transmission. Both transmission methods allow each pin in the chip to have a large bandwidth.

Referring to FIG. 1, the circuit architecture of a conventional signal-ended signal transmission is disclosed, wherein a reverser is used to push signals towards the other end of the transmission line, and another reverser is used to receive the signal. In circuit operation, the signals on the transmission line must be of full swing; otherwise, transmission errors are likely to happen. With respect to the power consumption, as the signals are of full swing, the power consumption is large. Besides, due to the full swing of the signals, great signal delay is caused in the rise delay and fall delay.

Referring to FIG. 2, the circuit architecture of a conventional level converter CLC is disclosed. The circuit architecture can convert signals with reduced swings into full-swing signals at the receiving unit. The disadvantage of the circuit architecture is that two supply voltages VDDH, VDDL are required. When the supply voltage VDDL drops to some extent, the circuit cannot operate normally and the delay of the signal transmission will also be increased accordingly.

Referring to FIG. 3, the circuit architecture of a conventional symmetric level converter SLC is disclosed. The circuit architecture requires three supply voltages VDD, VCL, and VSL. Two additional supply voltages VCL and VSL limit the swing on the transmission line. And two transistors of low critical voltage are desired to increase the operating speed of the SLC. As a result, a special process is adopted to achieve the object, resulting in an increase of the cost of the chip.

Referring to FIG. 4, the circuit architecture of a conventional symmetric source follower driver with level converter SSDLC is disclosed. The circuit architecture can overcome the disadvantage of employing two transistors of low critical voltage to improve the operating speed as illustrated above in FIG. 3. However, the use of the symmetric source follower driver SSD may limit the swing range on the transmission line. And as the driving force of the SSD is inadequate, it requires a large-size transistor when pushing a long transmission line.

Referring to FIG. 5, the circuit architecture of a conventional asymmetric source follower driver with level converter ASDLC is disclosed. However, the asymmetric source follower driver ASD may still limit the swing range on the transmission line.

Referring to FIG. 6, the architecture of a convention single-ended current-mode circuit is disclosed, which can provide a strong driving force during the signal conversion, thus reducing the delay time of the interconnect. When no signal is converted, a driving circuit of low swing is used to save power. In the circuit architecture, the input end of the receiver is virtually grounded, so the receiving signal is easily interfered by noises, resulting in circuit operating errors.

Referring to FIG. 7, the architecture of a conventional pulse wave current-mode circuit is disclosed. The circuit architecture allows the signal received to the output point by means of current duplication, and has a low quiescent current. However, the width of the pulse wave may generate parasitic resistance and parasitic capacitance effects on the transmission line due to various lengths and widths of the transmission line. Therefore, the pulse wave width of the signal cannot be too small.

The bidirectional signal transmission mode is a method for multiplying the amount of data transmitted between chips. For the signal transmission between chips, the size of the termination resistor is exact. However, for the signal transmission on chips, the size of the termination resistor is not so exact due to process drift, thus the design of signal transmission on chips is not suitable.

Referring to FIG. 8, the architecture of a first conventional bidirectional signal circuit is disclosed; wherein double drivers are required to perform signal comparison, thus causing large power consumption. Besides, as the two drivers require different impedance matches, it is very difficult in practice.

Referring to FIG. 9, the architecture of a conventional mixed-signal mode bidirectional signal input/output circuit is disclosed. When the input signal is an alternating current AC signal, the impedance on the transmission line is connected in parallel with the impedance at the other transmission end, so the input differential pair impedance matches the transmission line. When a direct current (DC) signal is transmitted, a receiving unit will make an offset error. Therefore, transistors must be added in the circuit to correct the offset error. Besides, the voltage level at the output end of the transmission unit is close to the supply voltage, so the swing voltage can be reduced in an AC operation.

Referring to FIG. 10, the circuit architecture of the receiving end of a conventional bidirectional transmission circuit is disclosed. In the circuit architecture, too many transistor devices are cascaded, so it cannot be applied in a deep sub-micrometer process. Besides, the design of the circuit architecture can only be adopted when the impedance is known, so it can only be applied to the transmission interface between chips, instead of the transmission in chips.

Referring to FIG. 11, the architecture of a conventional point-to-point bidirectional transmission circuit on a current-sensing chip is disclosed. Since a pulldown N-type transistor should provide a path with low resistance, the dimension of the N-type transistor should be large, while a pullup P-type transistor recharges the transmission line, so as to reduce the interference caused by noises. Besides, the latch at the output end discharges the output end via the delay line.

However, in the aforementioned single-ended or bidirectional signal transmission circuit architecture, the parasitic capacitance on the transmission line may be increased with the prolonging of the transmission line, and data transmission rates may be significantly decreased. Therefore, the current-mode signal transmission on chips is applicable for the transmission of a long transmission line.

As such, a current-mode signal transmission circuit is desired to overcome the shortcomings of the prior art.

SUMMARY OF THE INVENTION

In view of the above, the object of the invention is to provide a bidirectional current-mode transceiver applicable to the transmission circuit architecture between chips, so as to overcome the problem of delay caused by the large area, great power consumption, and long transmission line of the conventional bidirectional signal transmission circuit.

To achieve the above object, the bidirectional current-mode transceiver disclosed in the invention includes two transmission units and two receiving units. A transmission unit and a receiving unit constitute a pair group. Two transmission units are coupled to each other via the transmission line. The transmission unit includes a conversion circuit and a first current source, while the receiving unit includes a second current source and a reverser. In the transmission unit, the conversion circuit is used to convert the input voltage into an output current, and the first current source is used to transmit the output current. In the receiving unit, the second current source is used to mirror the output current of the transmission unit, and the reverser is used to generate an output voltage according to the output current.

According to the bidirectional current-mode transceiver disclosed in the invention, various bidirectional current-mode transceivers are formed by changing the way to connect the circuits in the transmission unit and the receiving unit. Each of the bidirectional current-mode transceivers can improve the transmission rate on the transmission line, and reduce the swing of the voltage signals on the transmission line by coupling a termination resistor to the transmission unit, thereby improving the operating speed of the transmission unit. Therefore, the bidirectional current-mode transceiver according to the invention can be applied to a long transmission line.

The detailed features and advantages of the invention are discussed in detail in the following embodiments. Anybody skilled in the related arts can easily understand and implement the content of the technology of the invention. Furthermore, the relative objects and advantages of the invention are apparent to those skilled in the related arts according to the content disclosed in the specification, claims, and drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
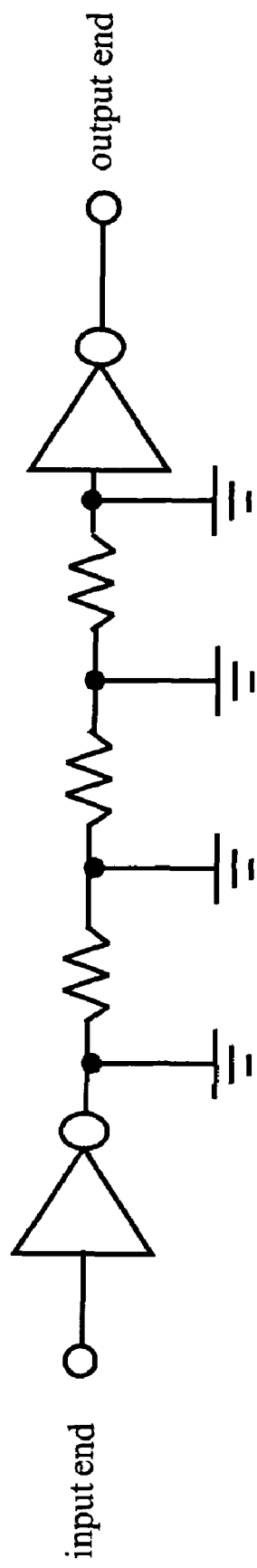
FIG. 1 depicts the architecture of a conventional single-ended signal transmission circuit.
Figure 2:
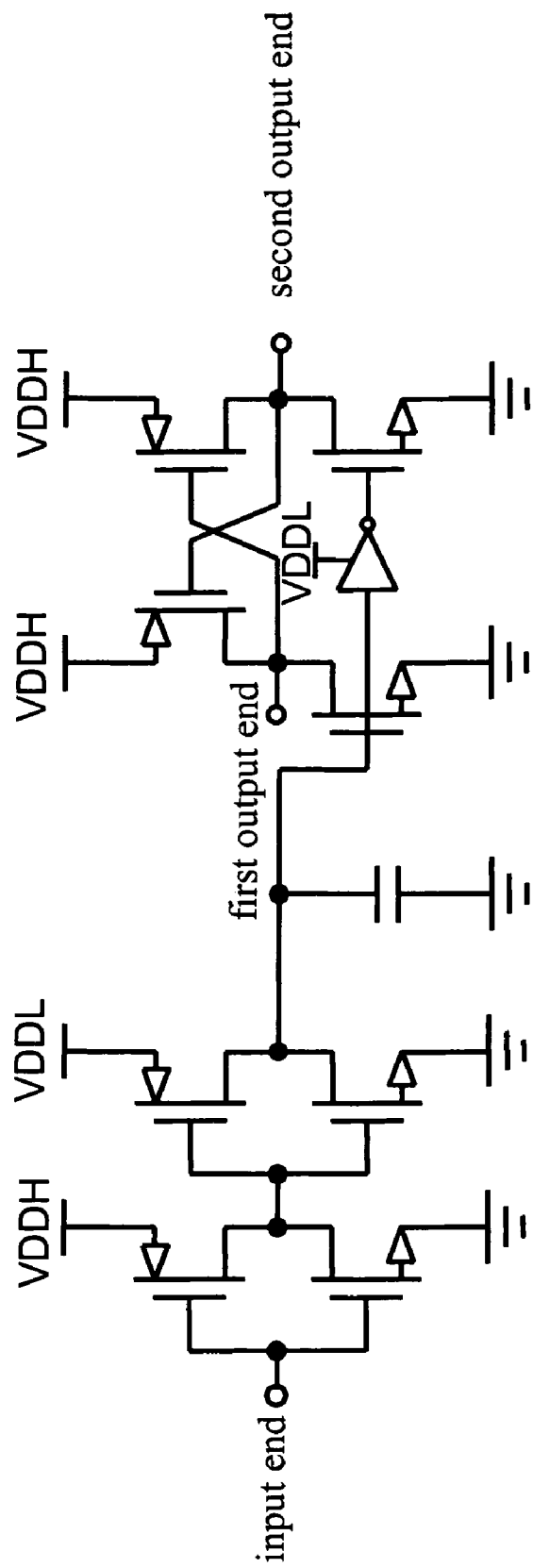
FIG. 2 depicts the circuit architecture of a conventional level converter.
Figure 3:
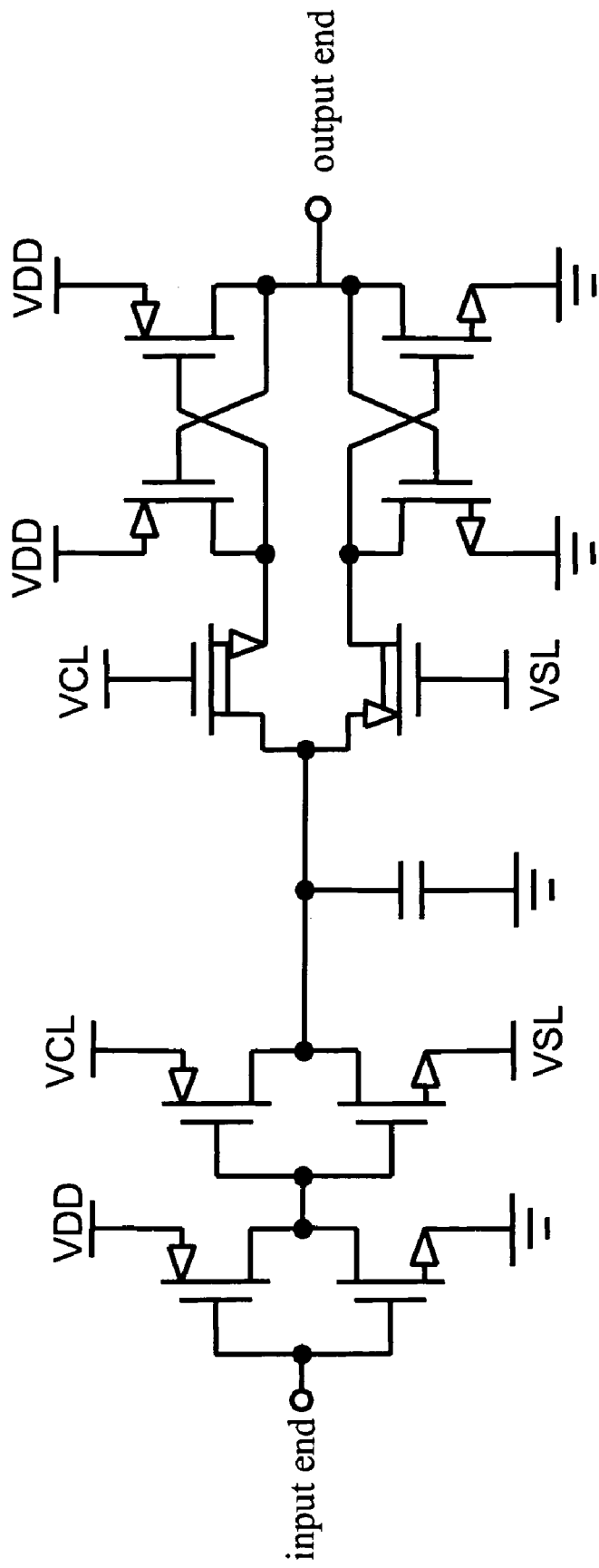
FIG. 3 depicts the circuit architecture of a conventional SLC.
Figure 4:
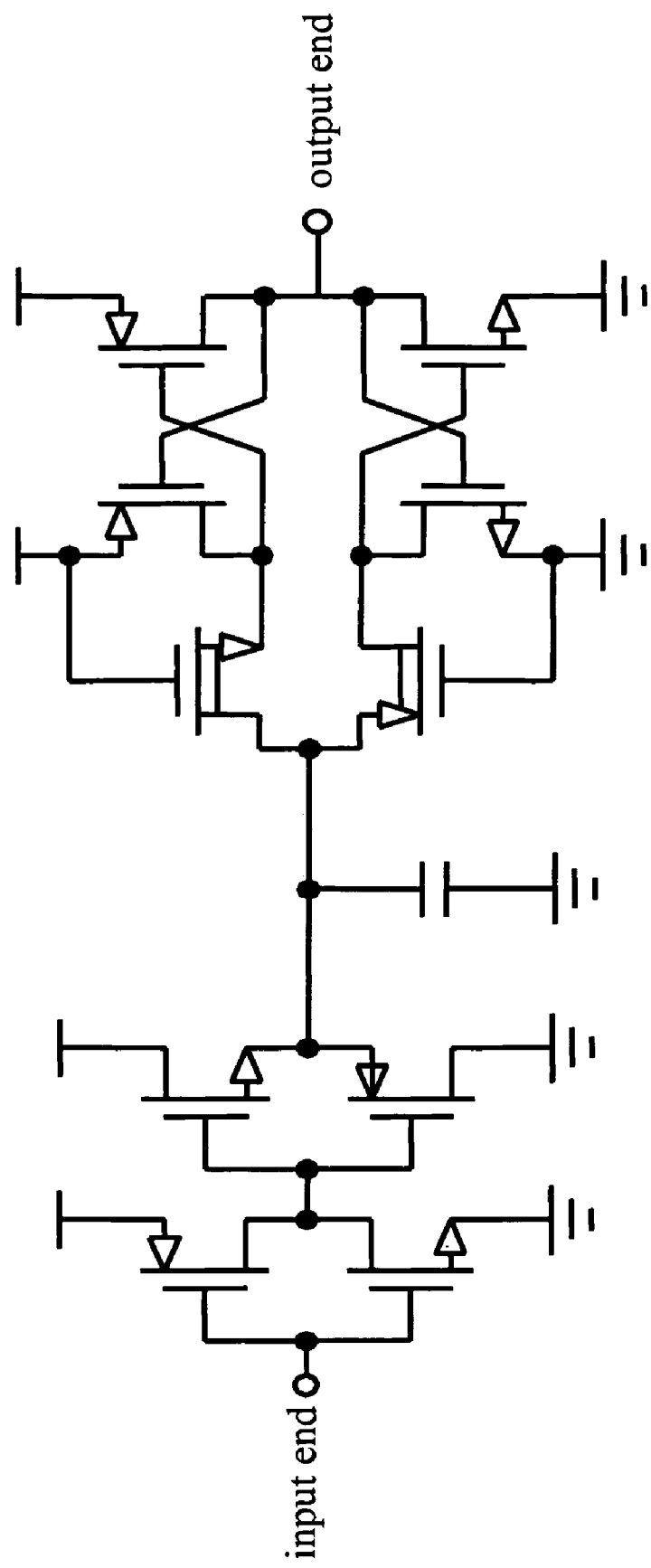
FIG. 4 depicts the circuit architecture of a conventional SSDLC.
Figure 5:
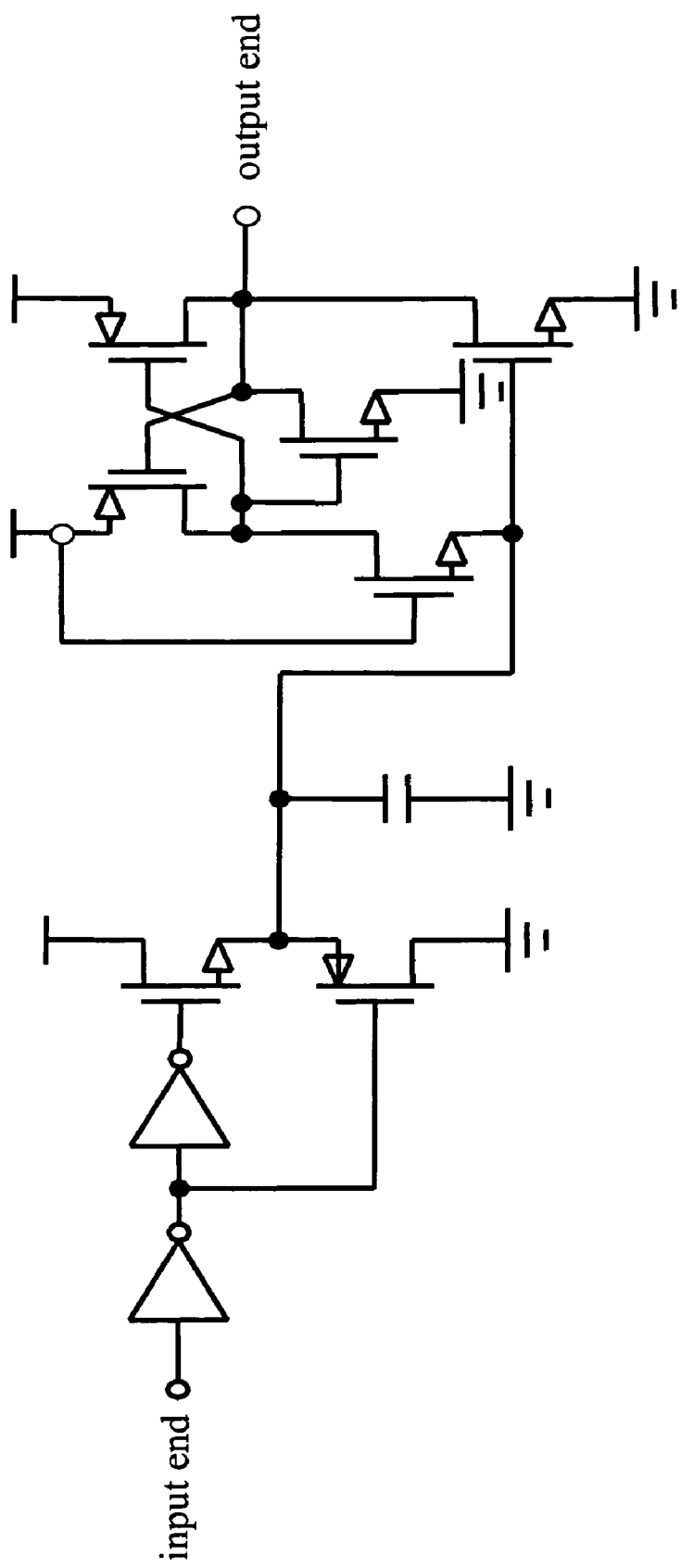
FIG. 5 depicts the circuit architecture of a conventional ASDLC.
Figure 6:
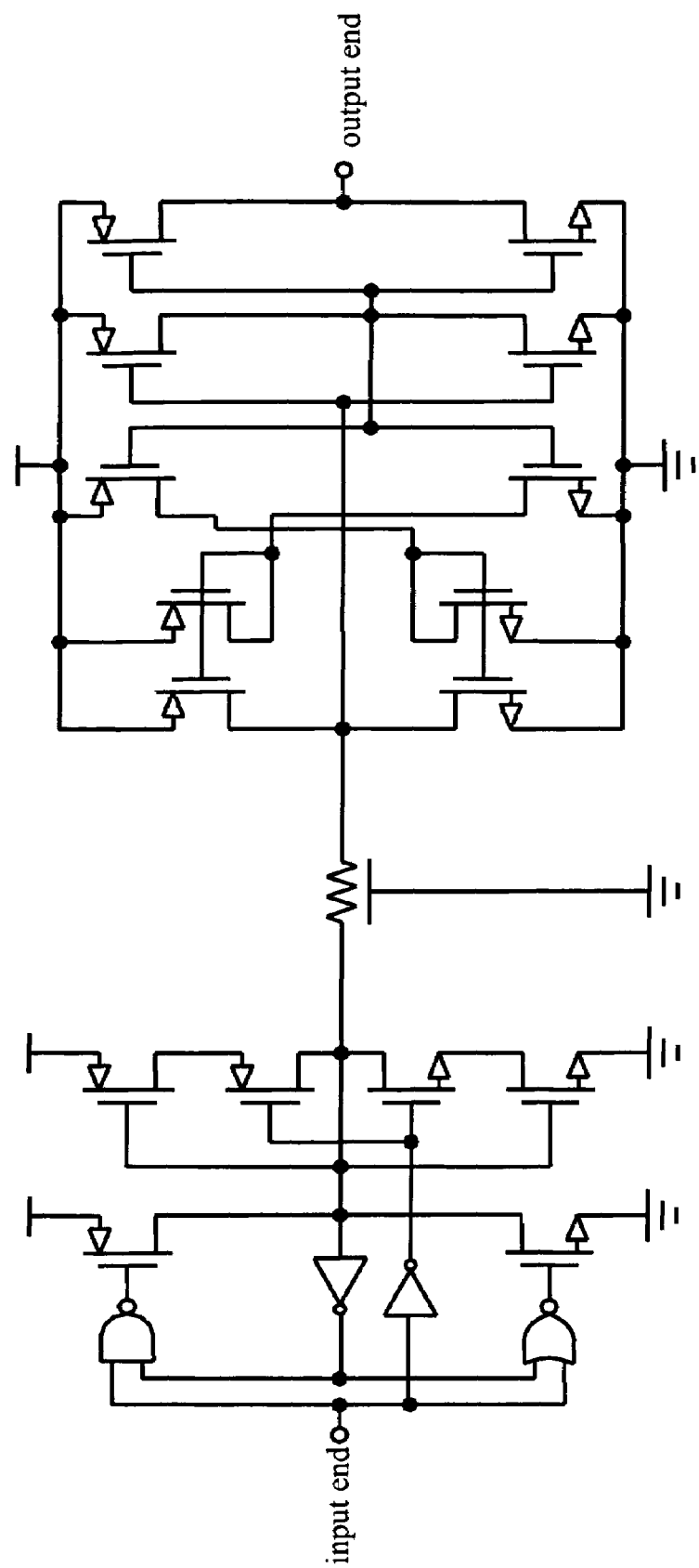
FIG. 6 depicts the architecture of a conventional single-ended current-mode circuit.
Figure 7:
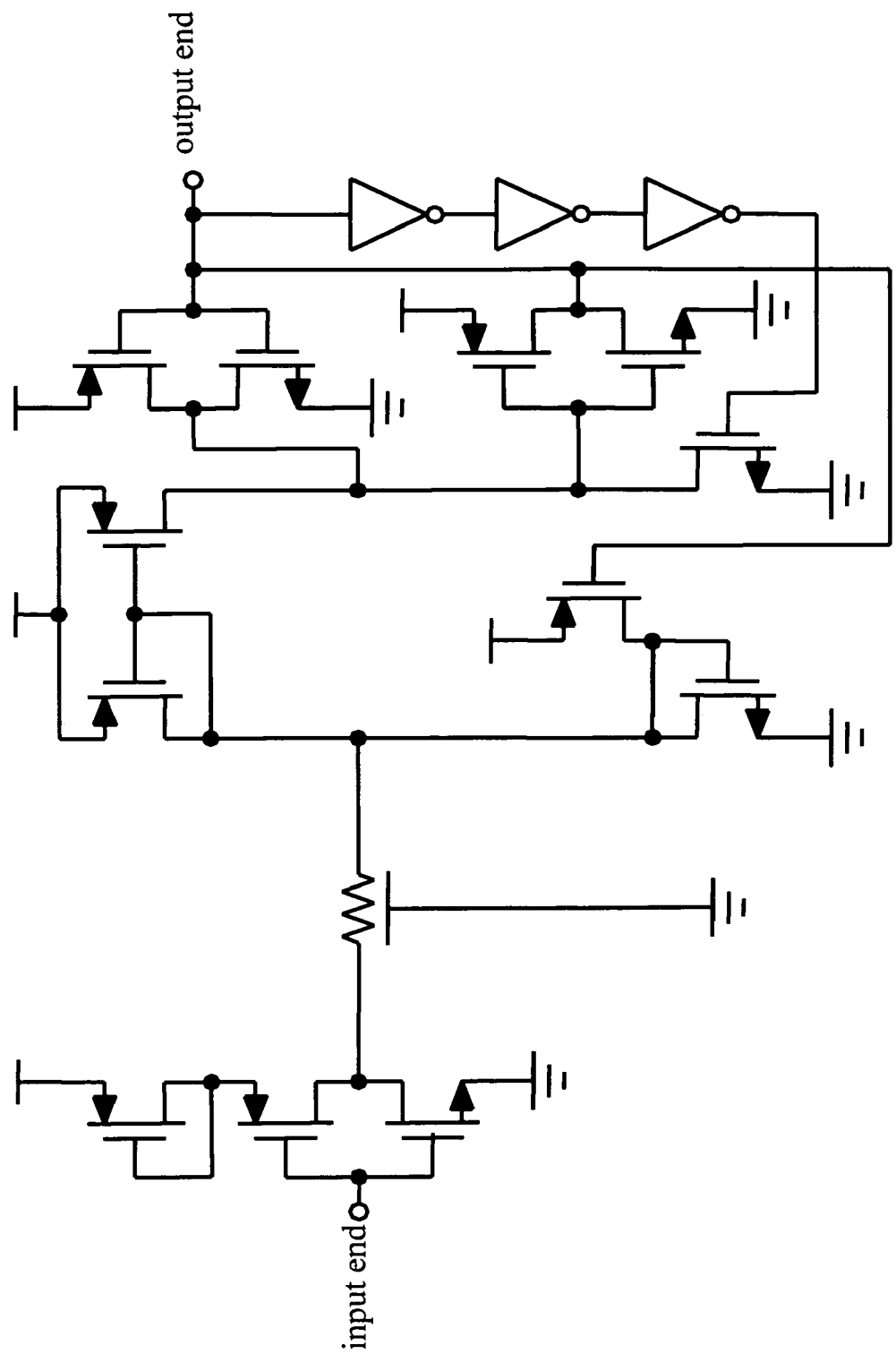
FIG. 7 depicts the architecture of a conventional pulse wave current-mode circuit.
Figure 8:
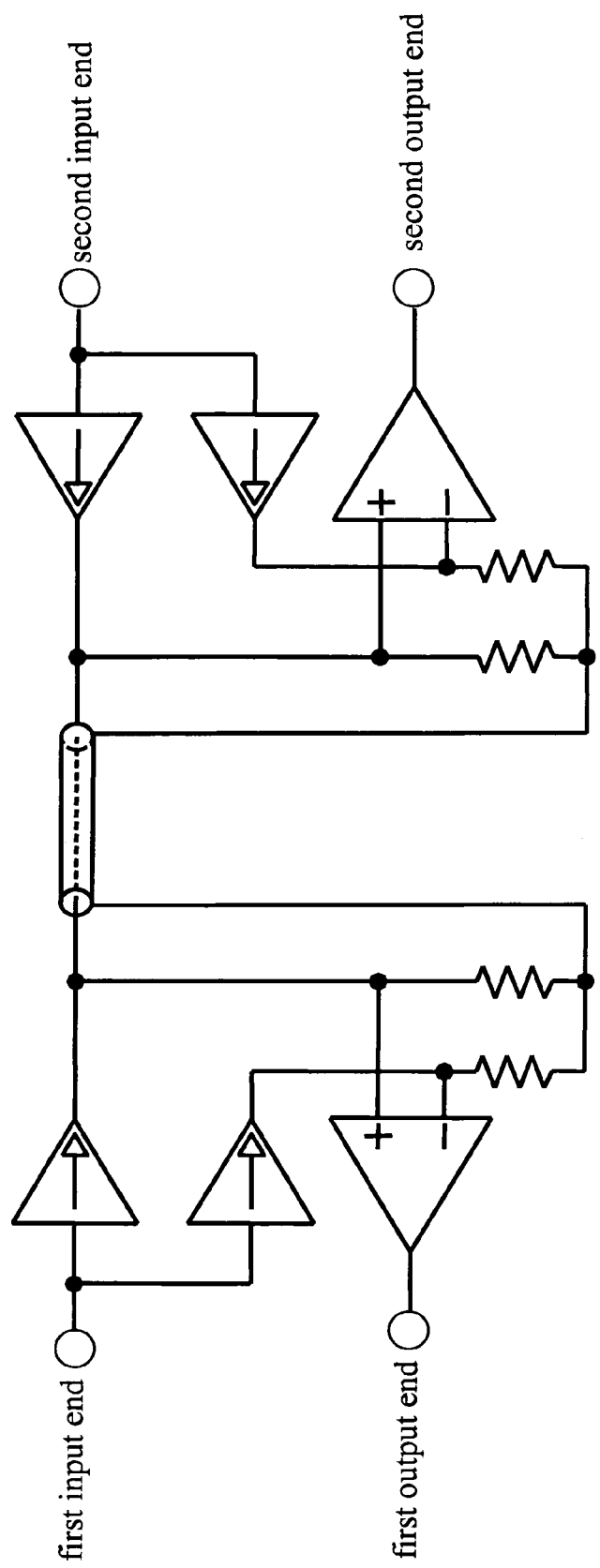
FIG. 8 depicts the architecture of a conventional bidirectional signal circuit.
Figure 9:
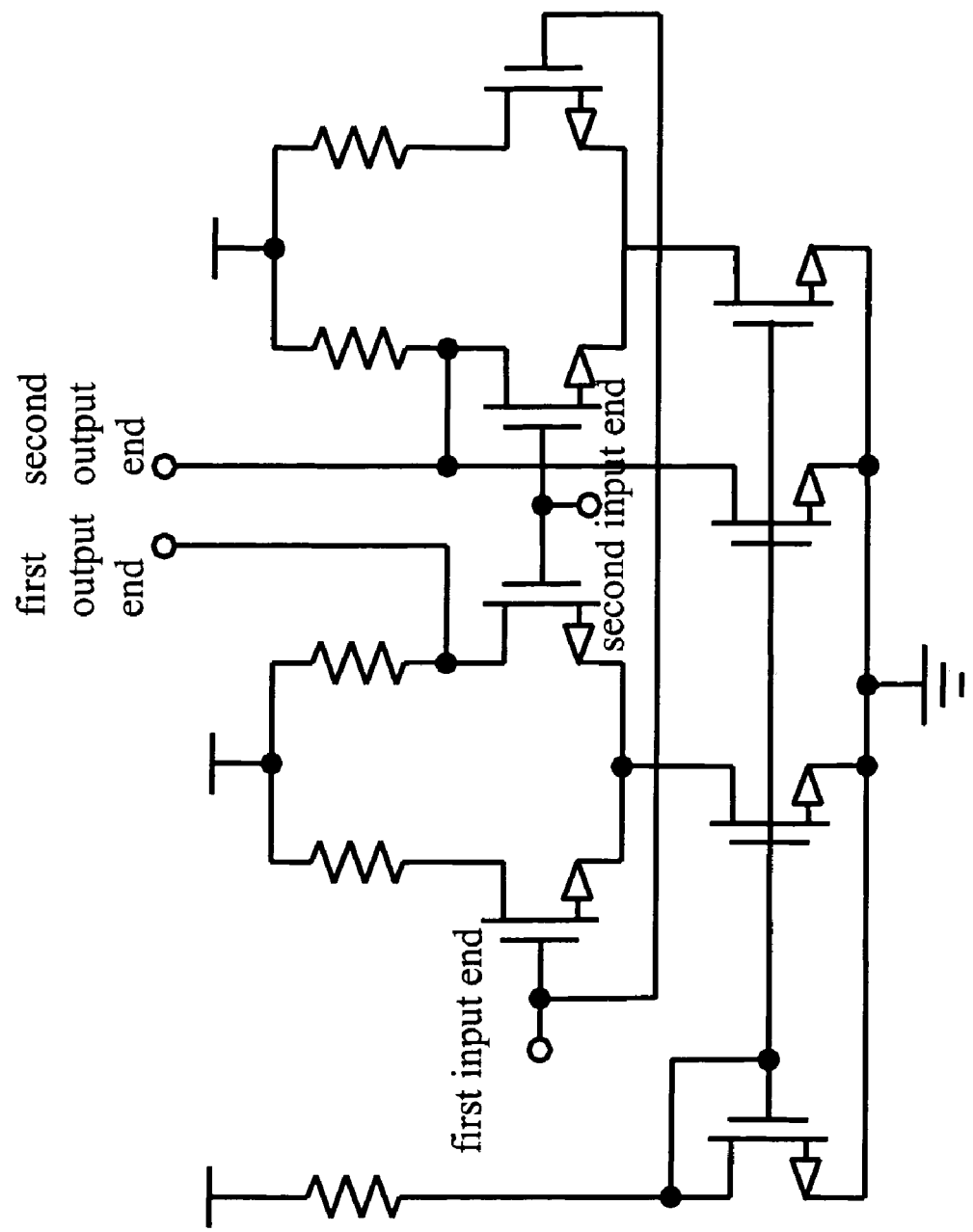
FIG. 9 depicts the architecture of a conventional mixed-signal mode bidirectional signal input/output circuit.
Figure 10:
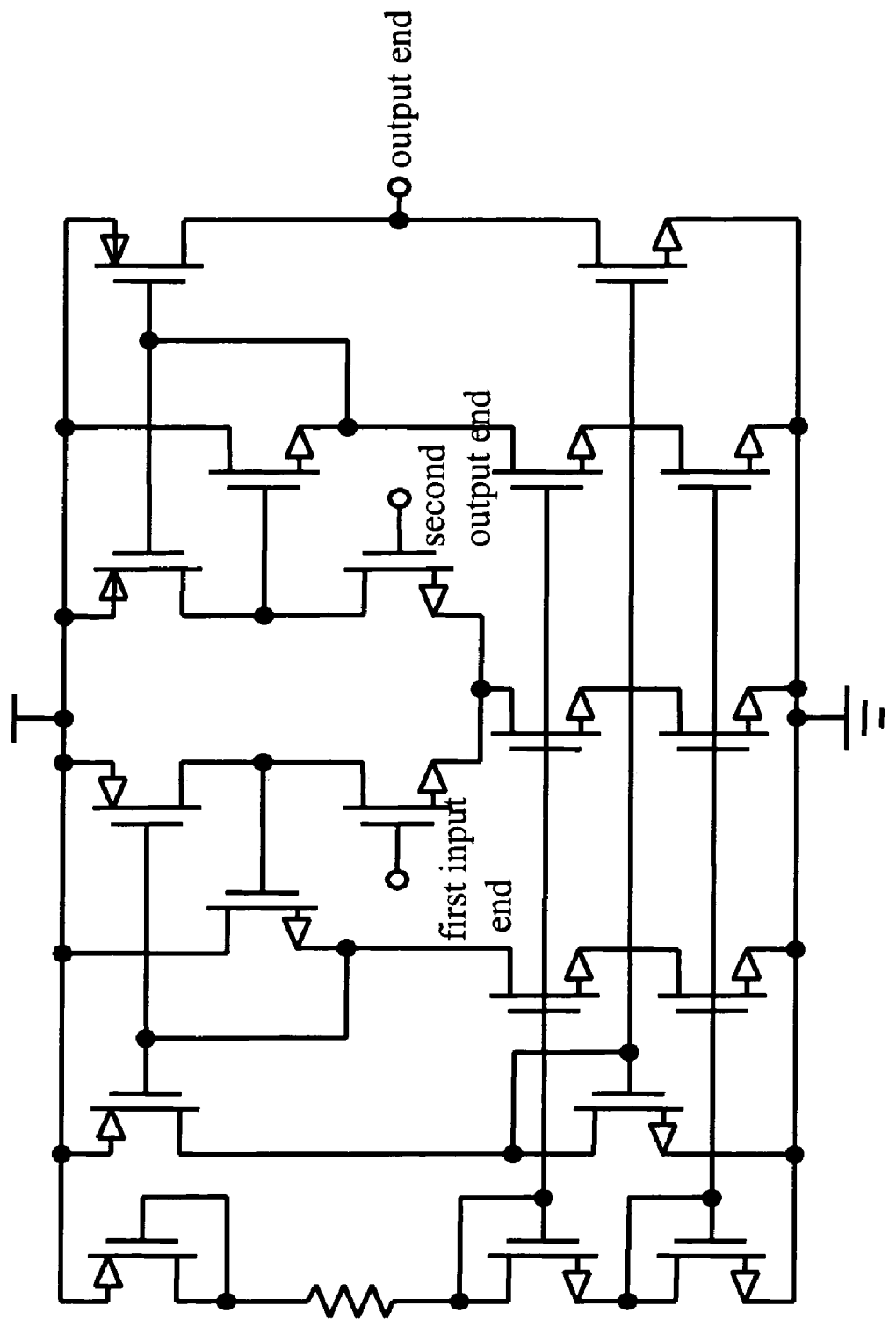
FIG. 10 depicts the circuit architecture of the receiving end of a conventional bidirectional transceiver.
Figure 11:
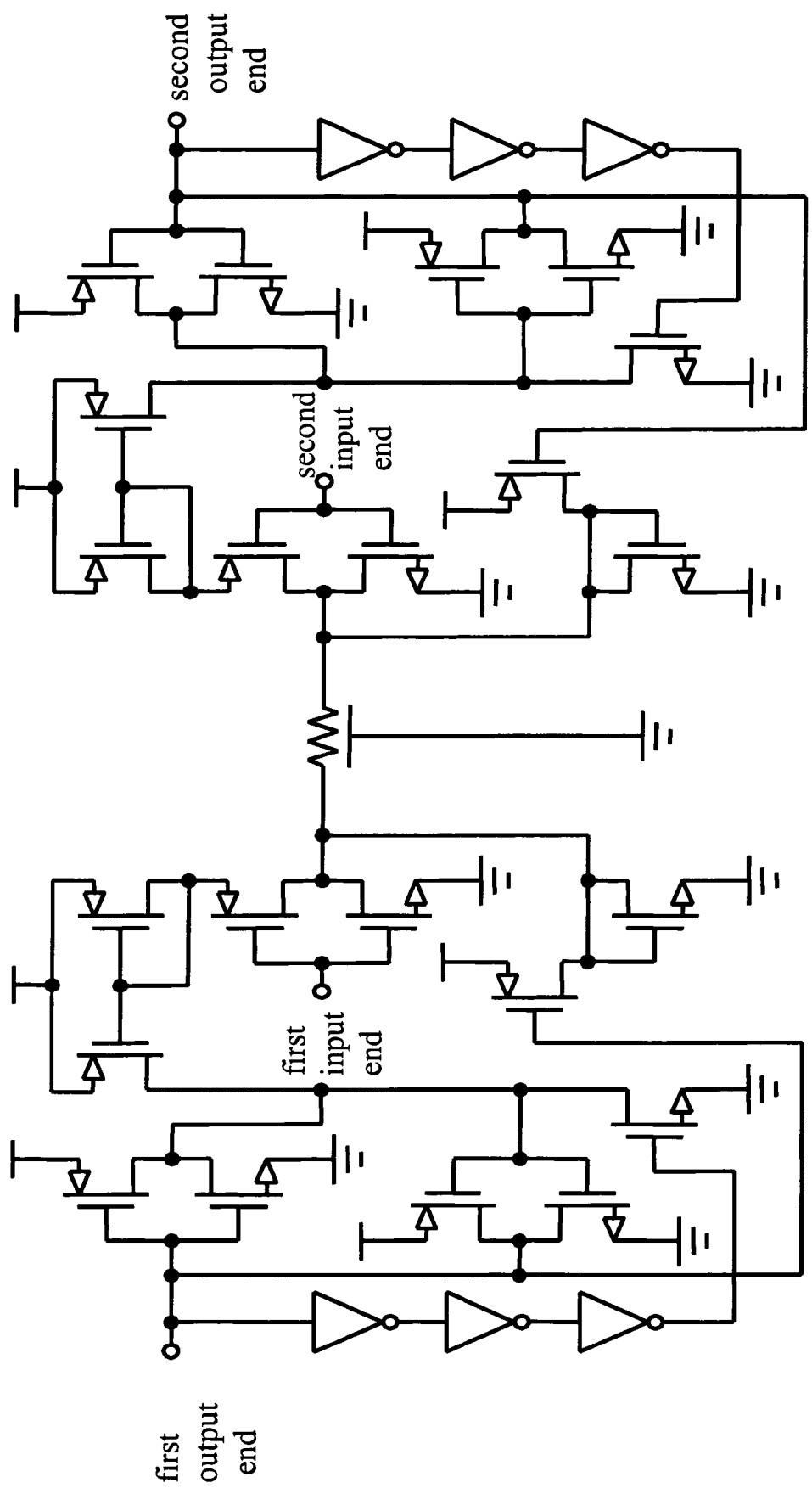
FIG. 11 depicts the architecture of a conventional point-to-point bidirectional transmission circuit on a current-sensing chip.
Figure 12:
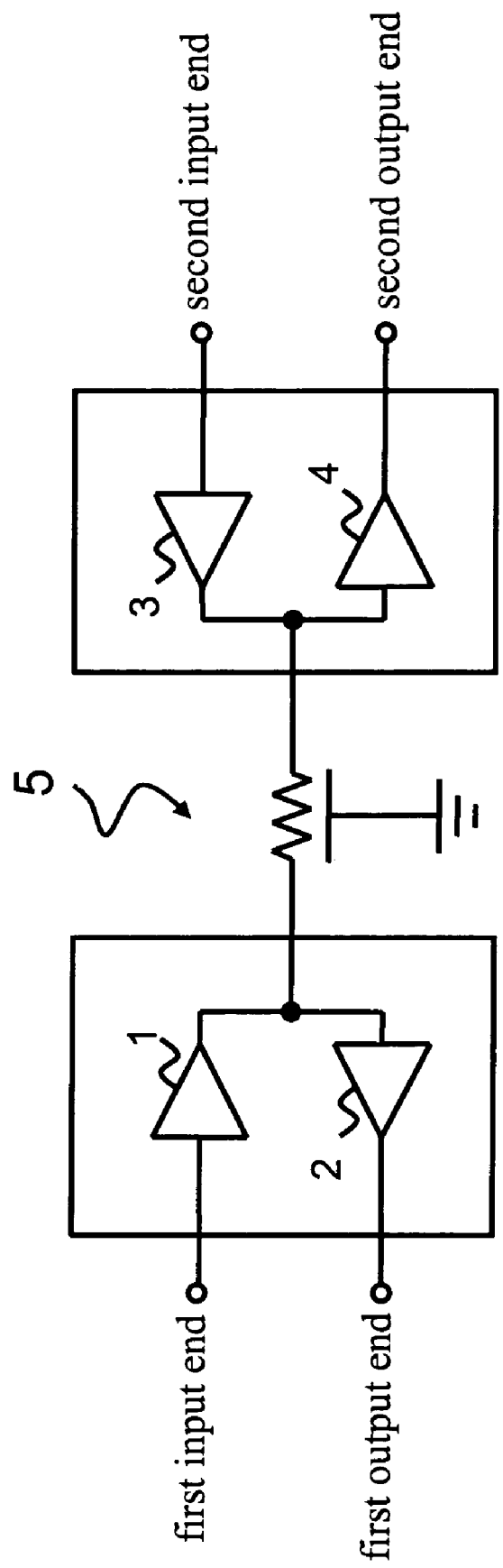
FIG. 12 is the schematic view of the conventional bidirectional signal transmission architecture.

Referring to FIG. 12, it is a schematic view of the conventional bidirectional signal transmission architecture suitable for transmitting between chips. The architecture includes two transmission units 1, 3 and two receiving units 2, 4, wherein a transmission unit and a receiving unit constitute a pair group, and two pair groups are coupled to each other via a transmission line 5. The bidirectional current-mode transceiver provided by the present invention adopts the same circuit architecture. However, the shortcomings of the large area of and great power consumption required by the conventional bidirectional signal transmission circuit should be overcome by changing the circuit design.

Figure 13:
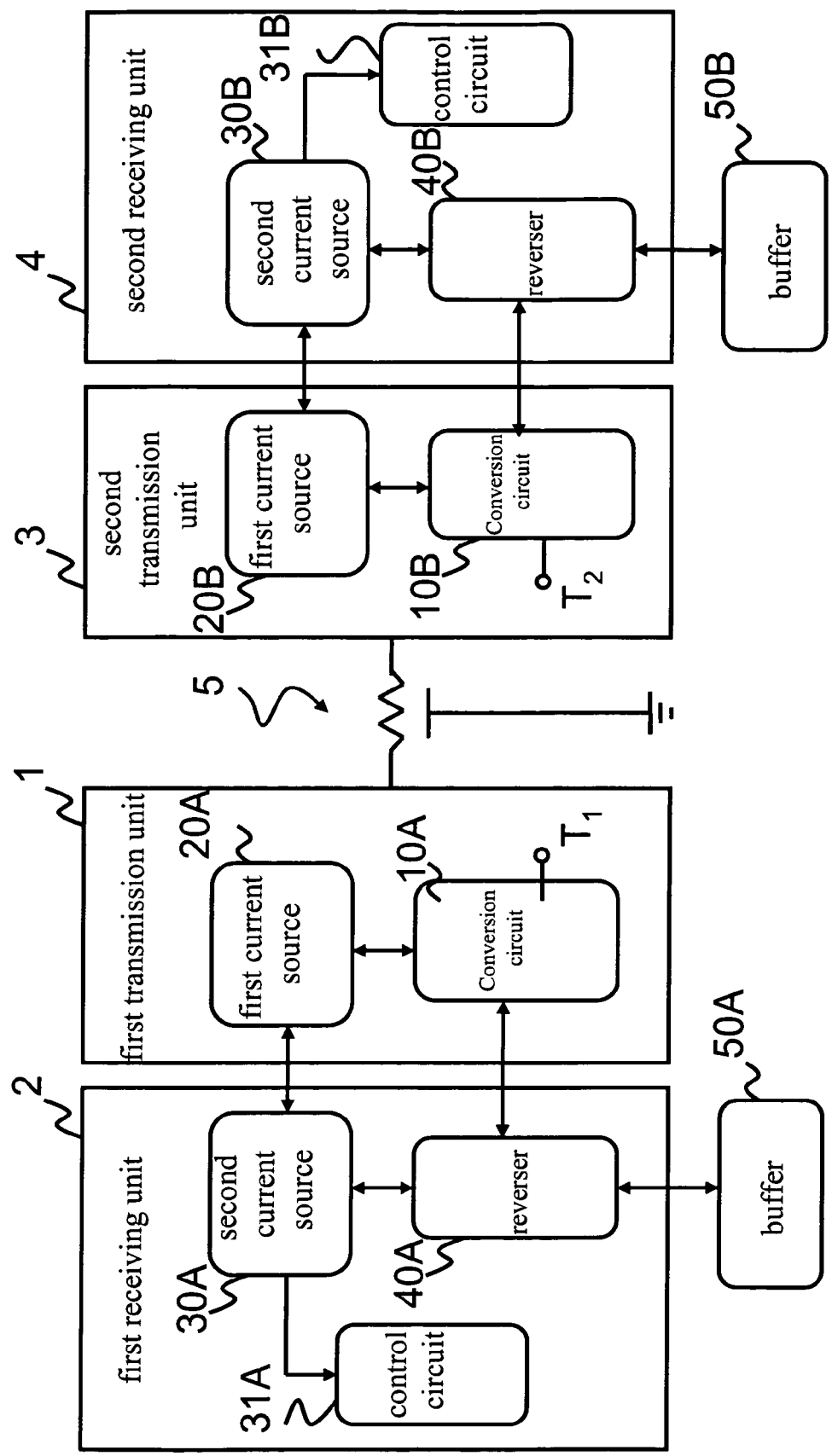
FIG. 13 is the block diagram of a bidirectional current-mode transceiver according to the invention.

Referring to FIG. 13, it is a block diagram of the bidirectional current-mode transceiver provided in the invention. The bidirectional current-mode transceiver comprises first and second transmission units 1, 3, and first and second receiving units 2, 4, wherein the first transmission unit 1 and the second transmission unit 3 are coupled to each other via a transmission line 5. As the block diagram of the first transmission unit 1 is identical with that of the second transmission unit 3, and the block diagram of the first receiving unit 2 is identical with that of the second receiving unit 4, the block diagrams of the first transmission unit 1 and the second transmission unit 3 in FIG. 13 are given the same name, but are distinguished by different numerals.

The first and second transmission units 1, 3 are used to receive the input voltage signals respectively, while the first and second receiving units 2, 4 are used to transmit the input voltage signals respectively. The first and second transmission units 1, 3 include conversion circuits 10A, 10B and multiple first current sources 20A, 20B, while the first and second receiving units 2, 4 include multiple second current sources 30A, 30B and reversers 40A, 40B.

The conversion circuits 10A, 10B include input ends $T_1$, $T_2$, for receiving the input voltage signals, and converting the input voltage signals into output current signals. The first current sources 20A, 20B are used to transmit the output current signals of the conversion circuits 10A, 10B. The second current sources 30A, 30B are coupled to the first current sources 20A, 20B, for mirroring the output current signals. The reversers 40A, 40B are coupled to the conversion circuits 10A, 10B and the second current sources 30A, 30B, for generating voltage signals after the output current signals pass through the loop, i.e., converting duplicated output current signals into output voltage signals, wherein the output voltage signals equal the input voltage signals.

Moreover, the bidirectional current-mode transceiver further comprises buffers 50A, 50B for outputting the output voltage signals. Besides, the first and second receiving units 2, 4 further comprise control circuits 31A, 31B, for controlling the second current sources 30A, 30B in an approximately cutoff state when turned off.

In short, the operation of the bidirectional current-mode transceiver is described as follows. The first transmission unit 1 comprises an input end $T_1$ for receiving input voltage signals, and converting the input voltage signals into output current signals. Then, the first receiving unit 2 duplicates and converts the output current signals into output voltage signals, for transmitting the input voltage signals, wherein the output voltage signals equal the input voltage signals. Likewise, the second transmission unit 3 comprises an input end $T_2$, for receiving the input voltage signals, and converting the input voltage signals into output current signals. Then, the second receiving unit 4 duplicates and converts the output current signals into output voltage signals, for transmitting the input voltage signals, wherein the output voltage signals equal the input voltage signals.

Figure 14:
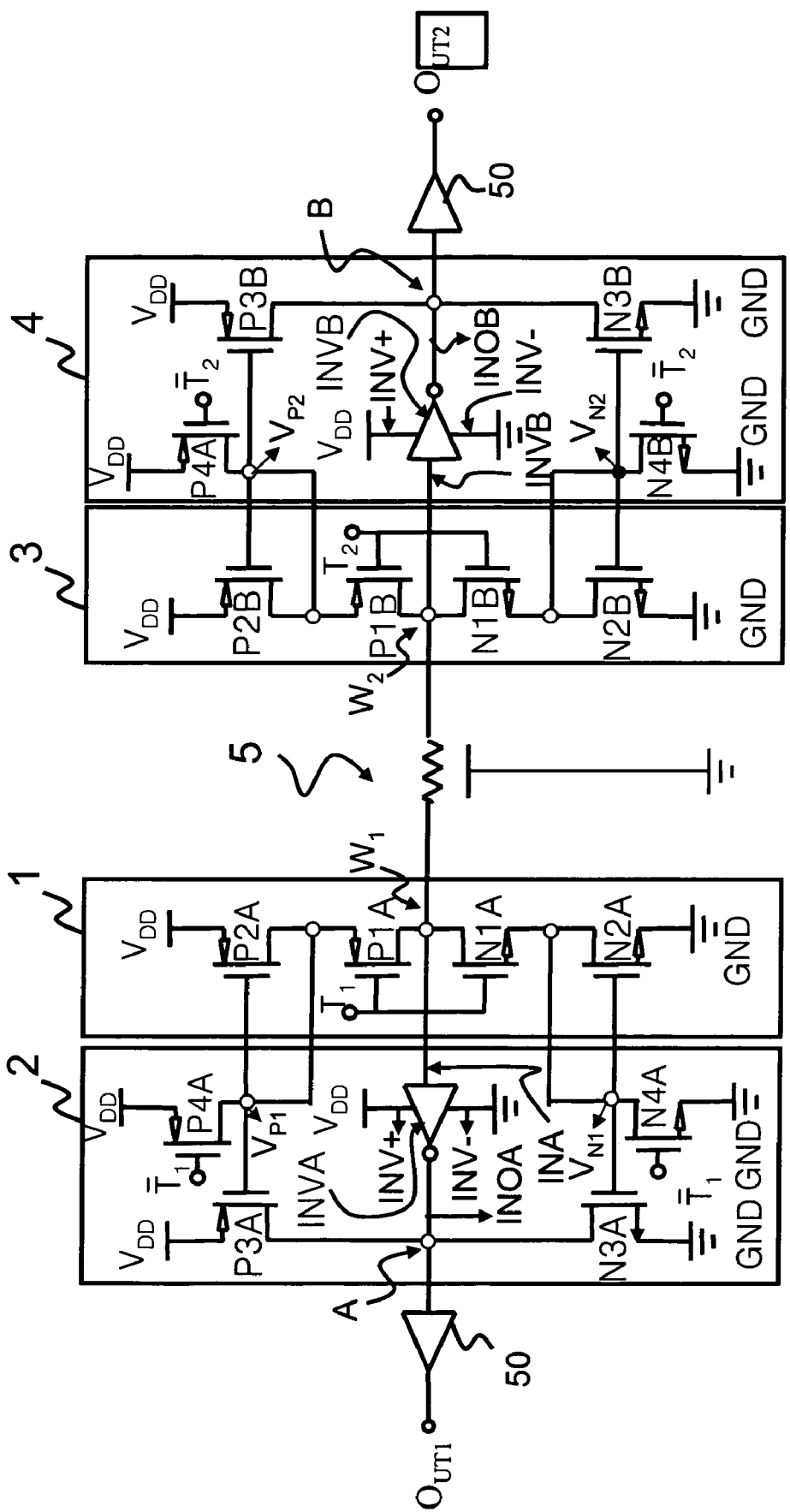
FIG. 14 is the detailed circuit diagram of the bidirectional current-mode transceiver according to the first embodiment of the invention.

Referring to FIG. 14, it is a detailed circuit diagram of the bidirectional current-mode transceiver according to the first embodiment of the invention. Corresponding to FIG. 13, FIG. 14 depicts detailed circuit diagrams of each of block diagrams of the first and second transmission units 1, 3 correspondingly. As the circuit diagram of the first transmission unit 1 is identical to that of the second transmission unit 3, and the circuit diagram of the first receiving unit 2 is identical to that of the second receiving unit 4, each transistor in the circuit diagrams of the first transmission unit 1 and the second transmission unit 3 in FIG. 14 is given the same name, but distinguished by a different numeral.

The conversion circuits 10A, 10B in the first and second transmission units 1, 3 include first P-type transistors P1A, P1B and first N-type transistors N1A, N1B, while multiple first current sources 20A, 20B include second P-type transistors P2A, P2B and second N-type transistors N2A, N2B.

The reversers INVA, INVB in the first and second receiving units 2, 4 can be any circuit provided with the function of reversing signals. The second current sources 30A, 30B include third P-type transistors P3A, P3B and third N-type transistors N3A, N3B. The control circuits 31A, 31B include fourth P-type transistors P4A, P4B and fourth N-type transistors N4A, N4B, for controlling the third P-type transistors P3A, P3B and the third N-type transistors N3A, N3B in an approximately cutoff state when turned off.

The above-mentioned operating manner of each N-type transistor and P-type transistor is described as follows.

When the gate of the N-type transistor is coupled to the voltage signal corresponding to the supply voltage, the N-type transistor is turned on, i.e., low impedance is between its source and drain. When the gate of the P-type transistor is coupled to the voltage signal corresponding to the ground level, the P-type transistor is turned on.

Furthermore, FIG. 14 illustrates the connection relation among each of the transistors in the first and second transmission units 1, 3 as well as the first and second receiving units 2, 4. In FIG. 14, the circuit at least has a supply voltage $V_{DD}$ and a ground GND for providing a normal operation of each transistor. The connection relation of each transistor in the first transmission unit I is described as follows. The gate, drain, and source of a first P-type transistor P1A are coupled to the gate, drain of the first N-type transistor N1A and the drain of the second P-type transistor P2A respectively. The gate and the drain of the second P-type transistor P2A are coupled to each other, while the source of the second P-type transistor P2A is coupled to the supply voltage $V_{DD}$. The source of the first N-type transistor N1A is coupled to the drain of the second N-type transistor N2A. The gate and the drain of the second N-type transistor N2A are coupled to each other, while the source of the second N-type transistor N2A is coupled to the ground GND. The point of the gate of the first P-type transistor P1A coupled to the gate of the first N-type transistor N1A is the input end $T_1$ for receiving voltage signals.

The connection relation of each transistor in the second transmission unit 3 is described as follows. The gate, drain, and source of the first P-type transistor P1B are coupled to the gate, drain of the first N-type transistor N1B and the drain of the second P-type transistor P2B respectively. The gate and the drain of the second P-type transistor P2B are coupled to each other, while the source of the second P-type transistor P2B is coupled to the supply voltage $V_{DD}$. The source of the first N-type transistor N1B is coupled to the drain of the second N-type transistor N2B. The gate and the drain of the second N-type transistor N2B are coupled to each other, while the source of the second N-type transistor N2B is coupled to the ground GND. The point of the gate of the first P-type transistor P1B coupled to the gate of the first N-type transistor N1B is an input end $T_2$ for receiving voltage signals.

In the first receiving unit 2, the input end INA of the reverser INVA is coupled to the drain of the first P-type transistor P1A and the drain of the first N-type transistor N1A. The output end INOA of the reverser INVA is coupled to the drain of the third P-type transistor P3A and the drain of the third N-type transistor N3A. And the positive end INV+ and the ground end INV− of the reverser INVA are coupled to the supply voltage $V_{DD}$ and the ground GND respectively. The gate and the source of the third P-type transistor P3A are coupled to the drain of the fourth P-type transistor P4A and the supply voltage $V_{DD}$ respectively. The gate and the source of the third N-type transistor N3A are coupled to the drain of the fourth N-type transistor N4A and the ground GND respectively. The drain of the third P-type transistor P3A and the drain of the third N-type transistor N3A are coupled to each other.

The gate of the fourth P-type transistor P4A and the gate of the fourth N-type transistor N4A are coupled to each other, for inputting reversed input voltage signals $T_1$. The drain of the fourth P-type transistor P4A is coupled to the gate of the second P-type transistor P2A. The drain of the fourth N-type transistor N4A is coupled to the gate of the second N-type transistor N2A. The source of the fourth P-type transistor P4A and the source of the fourth N-type transistor N4A are coupled to the supply voltage $V_{DD}$ and the ground GND respectively.

In the second receiving unit 4, the input end INB of the reverser INVB is coupled to the drain of the first P-type transistor P1B and the drain of the first N-type transistor N1B. The output end INOB of the reverser INVB is coupled to the drain of the third P-type transistor P3B and the drain of the third N-type transistor N3B. And the positive end INV+ and the ground INV− of the reverser INVB are coupled to the supply voltage $V_{DD}$ and the ground GND respectively. The gate and the source of the third P-type transistor P3B are coupled to the drain of the fourth P-type transistor P4B and the supply voltage $V_{DD}$ respectively. The gate and the source of the third N-type transistor N3B are respectively coupled to the drain of the fourth N-type transistor N4B and the ground GND. The drain of the third P-type transistor P3B and the drain of the third N-type transistor N3B are coupled to each other.

The gate of the fourth P-type transistor P4B and the gate of the fourth N-type transistor N4B are coupled to each other, for inputting reversed input voltage signals $T_2$. The drain of the fourth P-type transistor P4B is coupled to the gate of the second P-type transistor P2B. The drain of the fourth N-type transistor N4B is coupled to the gate of the second N-type transistor N2B. The source of the fourth P-type transistor P4B and the source of the fourth N-type transistor N4B are coupled to the supply voltage $V_{DD}$ and the ground GND respectively.

One end $W_1$ of the transmission line 5 is electrically coupled to the drain of the first P-type transistor P1A and the drain of the first N-type transistor N1A in the first transmission unit 1. The other end $W_2$ of the transmission line 5 is electrically coupled to the drain of the first P-type transistor P1B and the drain of the first N-type transistor N1B in the second transmission unit 3, for forming the detailed circuit diagram of the bidirectional current-mode transceiver according to the invention.

Generally, in a digital circuit, the existence of voltage is regarded as "logic 1", and the inexistence of voltage is regarded as "logic 0". When "logic 1" is applied to the gate of an N-type transistor, the N-type transistor is turned on. When "logic 0" is applied to the gate of an N-type transistor, the N-type transistor is turned off. On the contrary, when "logic 0" is applied to the gate of a P-type transistor, the P-type transistor is turned on. When "logic 1" is applied to the gate of a P-type transistor, the P-type transistor is turned off.

FIG. 14 depicts the operating manner of each transistor. The bidirectional current-mode transceiver provided by the invention has two input ends $T_1$, $T_2$, so it has four input states. The detailed operation of each transistor when the bidirectional current-mode transceiver is in every state is illustrated in the following.

State 1:

When the input ends $T_1$, $T_2$ of the first and second transmission units 1, 3 receive "logic 0", i.e., 0, 0, the gates of the first P-type transistors P1A, P2A and the gates of the first N-type transistors N1A, N1B in the first and second transmission units 1, 3 receive voltage close to the ground level or 0 V.

The first P-type transistors P1A, P1B, the second P-type transistors P2A, P2B, and the fourth N-type transistors N4A, N4B are all turned on. And The first N-type transistors N1A, N1B, the second N-type transistors N2A, N2B, the third N-type transistors N3A, N3B, the third P-type transistors P3A, P3B, and the fourth P-type transistors P4A, P4B are all turned off.

The on of the first P-type transistors P1A, P1B and the second P-type transistors P2A, P2B and the off of the first N-type transistors N1A, N1B can make the voltage at both ends $W_1$, $W_2$ of the transmission line 5 and at the gates of the second P-type transistors P2A, P2B close to the supply voltage minus the critical voltage $|V_{tp}|$ of the first P-type transistor, and the voltage at the gates of the second N-type transistors N2A, N2B close to the ground level.

Furthermore, the voltage at the gates of the second P-type transistors P2A, P2B is close to the supply voltage $V_{DD}$ minus the critical voltage $|V_{tp}|$ of the P-type transistor and the voltage at the gates of the second N-type transistors N2A, N2B is close to the ground level, such that the third P-type transistors P3A, P3B and the third N-type transistors N3A, N3B are turned off.

Moreover, the voltage at both ends $W_1$, $W_2$ of the transmission line 5 is close to the supply voltage minus the critical voltage of the P-type transistor $V_{DD}-|V_{tp}|$, so the voltage at the input ends INA, INB of the reversers INVA, INVB is close to the supply voltage minus the critical voltage of the P-type transistor $V_{DD}-|V_{tp}|$, i.e., "logic 1". Therefore, the voltage at the output ends INOA, INOB of the reversers INVA, INVB is close to the ground level or 0 V, i.e., "logic 0". Besides, "logic 0" can be output through buffers 50A, 50B.

Moreover, the gates of the fourth P-type transistors P4A, P4B and the gates of the fourth N-type transistors N4A, N4B are coupled to reversed input voltage signals $T_1$, $T_2$, i.e., "logic 1", so the fourth P-type transistors P4A, P4B are turned off, while the fourth N-type transistors N4A, N4B are turned on.

State 2:

When the input ends $T_1$, $T_2$ of the first transmission unit 1 and the second transmission unit 3 respectively receive "logic 0" and "logic 1", i.e., 0, 1, the gate of the first P-type transistor P1A and the gate of the first N-type transistor N1A in the first transmission unit 1 both receive a voltage close to the ground level or 0 V. The gate of the first P-type transistor P1B and the gate of the first N-type transistor N1B in the second transmission unit 3 both receive voltage close to the supply voltage.

In the first transmission unit 1 and the first receiving unit 2, the first P-type transistor P1A, the second P-type transistor P2A, the third P-type transistor P3A, and the fourth N-type transistor N4A are all turned on, while the first N-type transistor N1A, the second N-type transistor N2A, the third N-type transistor N3A, and the fourth P-type transistor P4A are all turned off.

In the second transmission unit 3 and the second receiving unit 4, the first N-type transistor N1B, the second N-type transistor N2B, the third N-type transistor N3B, and the fourth P-type transistor P4B are all turned on, while the first P-type transistor P1B, the second P-type transistor P2B, the third P-type transistor P3B, and the fourth N-type transistor N4B are all turned off.

The on of the first P-type transistor P1A and the off of the first N-type transistor N1A in the first transmission unit 1 can make the voltage at one end $W_1$ of the transmission line 5 slightly lower than the supply voltage minus the critical voltage of the P-type transistor $V_{DD}-|V_{tp}|$, but slightly higher than half of the supply voltage $½ V_{DD}$. The on of the first N-type transistor N1B and the off of the first P-type transistor P1B in the second transmission unit 3 can make the voltage of the other end W2 of the transmission line 5 greater than the critical voltage $V_{tn}$ of the N-type transistor.

Therefore, the first P-type transistor P1A, the second P-type transistor P2A, the first N-type transistor N1B, and the second N-type transistor N2B form a current loop, with the current signal passing through the current loop from the first P-type transistor P1A to the first N-type transistor N1B. Besides, the on of the third P-type transistor P3A and the reverser INVA can also generate current signals, and at this time, a large current signal passes through the third P-type transistor P3A.

As the voltage at one end $W_1$ of the transmission line 5 is slightly higher than half of the supply voltage $½ V_{DD}$, the voltage obtained at the output end INOA of the reverser INVA is slightly lower than half of the supply voltage $½ V_{DD}$, and a large current signal passes through the third P-type transistor P3A. Therefore, "logic 1" can be obtained at the node A.

Meanwhile, a large current signal also pass through the third N-type transistor N3B, and the voltage at the other end W2 of the transmission line 5 is slightly lower than half of the supply voltage $½ V_{DD}$, so the voltage obtained at the output end INOB of the reverser INVB is slightly higher than half of the supply voltage $½ V_{DD}$. Therefore, "logic 0" is obtained at the node B.

Furthermore, both of the aforementioned "logic 0" and "logic 1" can be output through the buffers 50A, 50B.

State 3:

When the input ends $T_1$, $T_2$ of the first transmission unit 1 and the second transmission unit 3 respectively receive "logic 1" and "logic 0", i.e., 1, 0, the gate of the first P-type transistor P1A and the gate of the first N-type transistor N1A in the transmission unit 1 receive a voltage close to the supply voltage. And the gate of the first P-type transistor P1B and the gate of the first N-type transistor N1B in the second transmission unit 3 receive a voltage close to the ground level or 0 V.

In the first transmission unit 1 and the first receiving unit 2, the first P-type transistor P1A, the second P-type transistor P2A, the third P-type transistor P3A, and the fourth N-type transistor N4A are all turned off, while the first N-type transistor N1A, the second N-type transistor N2A, the third N-type transistor N3A, and the fourth P-type transistor P4A are all turned on.

In the second transmission unit 3 and the second receiving unit 4, the first N-type transistor N1B, the second N-type transistor N2B, the third N-type transistor N3B, and the fourth P-type transistor P4B are all turned off, while the first P-type transistor P1B, the second P-type transistor P2B, the third P-type transistor P3B, and the fourth N-type transistor N4B are all turned on.

The on of the first N-type transistor N1A and the off of the first P-type transistor P1A in the first transmission unit 1 may result in a voltage at one end $W_1$ of the transmission line 5 greater than the critical voltage $V_{tn}$ of the N-type transistor. The on of the first P-type transistor P1B and the off of the first N-type transistor N1B in the second transmission unit 3 may result in a voltage at the other end $W_2$ of the transmission line 5 lower than the supply voltage minus the critical voltage of the P-type transistor $V_{DD}-|V_{tp}|$.

Therefore, the first P-type transistor P1B, the second P-type transistor P2A, the first N-type transistor N1A, and the second N-type transistor N2A constitute a current loop, with a current signal passing through the current loop from the first P-type transistor P1B to the first N-type transistor N1A. Besides, the on of the third N-type transistor N3A and the reverser INVA can also generate current signals, and at this time, a large current signal may pass through the third N-type transistor N3A.

As the voltage at one end $W_1$ of the transmission line 5 is slightly lower than half of the supply voltage $½ V_{DD}$, the voltage obtained at the output end INOA of the reverser INVA is slightly higher than half of the supply voltage ½ $V_{DD}$, and a large current signal passes through the third N-type transistor N3A. Therefore, "logic 0" can be obtained at the node A.

Meanwhile, a large current signal also passes through the third P-type transistor P3B, and the voltage at the other end W2 of the transmission line 5 is slightly higher than half of the supply voltage ½ $V_{DD}$, so the voltage obtained at the output end INOB of the reverser INVB is slightly lower than half of the supply voltage ½ $V_{DD}$. Therefore, "logic 1" is obtained at the node B.

Furthermore, both of the aforementioned "logic 0" and "logic 1" can be output through the buffers 50A, 50B.

State 4:

When the input ends $T_1$, $T_2$ of the first and second transmission units 1, 3 receive "logic 1", i.e., 1, 1, the gates of the first P-type transistors P1A, P2A and the gates of the first N-type transistors N1A, N1B in the first and second transmission units 1, 3 receive a voltage close to the supply voltage.

The first N-type transistors N1A, N1B, the second N-type transistors N2A, N2B, and the fourth P-type transistors P4A, P4B are turned on. And the first P-type transistors P1A, P1B, the second P-type transistors P2A, P2B, the third N-type transistors N3A, N3B, the third P-type transistors P3A, P3B, and the fourth N-type transistors N4A, N4B are all turned off.

The on of the first N-type transistors N1A, N1B and the second N-type transistors N2A, N2B and the off of the first P-type transistors P1A, P1B can make a voltage at both ends $W_1$, $W_2$ of the transmission line 5 and at the gates of the second N-type transistors N2A, N2B close to the critical voltage $V_{tn}$ of the N-type transistor, and a voltage at the gates of the second P-type transistors P2A, P2B close to the supply voltage $V_{DD}$.

Moreover, voltage at the gates of the second P-type transistors P2A, P2B is close to the supply voltage $V_{DD}$, and voltage at the gates of the second N-type transistors N2A, N2B is close to the critical voltage $V_{tn}$ of the N-type transistor, resulting in the off of the third P-type transistors P3A, P3B and the third N-type transistors N3A, N3B. Besides, voltage at both ends of the transmission line 5 is close to the supply voltage $V_{DD}-|V_{tp}|$, so voltage at the input ends INA, INB of the reversers INVA, INVB is close to the critical voltage $|V_{tp}|$ of the P-type transistor, i.e., "logic 0".

Therefore, voltage at the output ends INOA, INOB of the reversers INVA, INVB is close to the supply voltage, i.e., "logic 1". Besides, the "logic 1" can be output through the buffers 50A, 50B.

Then, the gates of the fourth N-type transistors N4A, N4B and the gates of the fourth P-type transistors P4A, P4B are coupled with the reversed input voltage signals, i.e., "logic 0", so the fourth P-type transistors P4A, P4B are turned on, while the fourth N-type transistors N4A, N4B are turned off.

Figure 15:
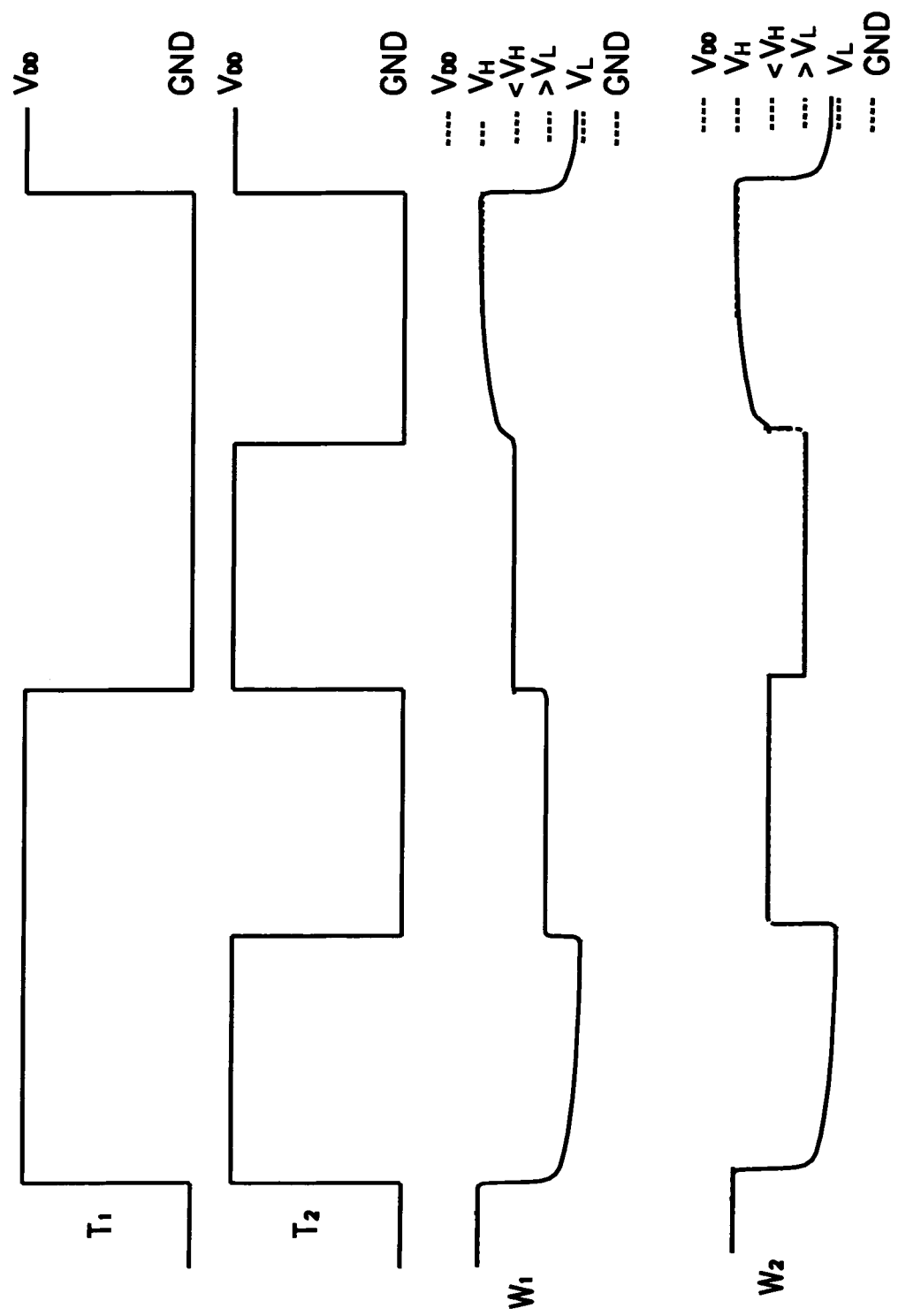
FIG. 15 depicts the input waveform of the bidirectional current-mode transceiver and the waveform charts of voltage changes at both ends of the transmission line.

Referring to FIG. 15, it depicts the input waveforms $T_1$, $T_2$ of the bidirectional transceiver in the aforementioned four states, and the waveform chart of the voltage changes at both ends $W_1$, $W_2$ of the transmission line 5. When the input ends $T_1$, $T_2$ of the bidirectional transceiver are "logic 1", voltage at both ends of the transmission line 5 is the critical voltage $V_{tn}$ of the N-type transistor. When the input ends $T_1$, $T_2$ of the bidirectional transceiver are "logic 0", the voltage at both ends of the transmission line 5 is close to the supply voltage minus the critical voltage of the P-type transistor $V_{DD}-|V_{tp}|$. When the input ends $T_1$, $T_2$ of the bidirectional transceiver are "logic 0" and "logic 1" or of "logic 1" and "logic 0", the voltage at both ends $W_1$, $W_2$ of the transmission line 5 is slightly lower than the supply voltage minus the critical voltage of the P-type transistor $V_{DD}-|V_{tp}|$ or is greater than the critical voltage $V_{tn}$ of the N-type transistor.

Then, referring to Table 1, it depicts the voltage changes at each node of the bidirectional transceiver in the aforementioned four states. In Table 1, $V_{P1}$, $V_{P2}$, $V_{N1}$, and $V_{N2}$ are all nodes in FIG. 14. $O_{ut1}$ and $O_{ut2}$ represent the output ends of the bidirectional transceiver. $V_L$ represents the critical voltage $V_{tn}$ of the N-type transistor. $V_H$ represents the supply voltage minus the critical voltage of the P-type transistor $V_{DD}-|V_{tp}|$. $<V_H$ represents being lower than the supply voltage minus the critical voltage of the P-type transistor $V_{DD}-|V_{tp}|$, and $>V_H$ represents being greater than the supply voltage minus the critical voltage of the P-type transistor $V_{DD}-|V_{tp}|$. $<V_L$ represents being lower than the critical voltage $V_{tn}$ of the N-type transistor, while $>V_L$ represents being greater than the critical voltage $V_{tn}$ of the N-type transistor.

TABLE 1

| | $T_1$ | $T_2$ | $W_1$ | $W_2$ | $V_{P1}$ | $V_{N1}$ | $V_{P2}$ | $V_{N2}$ | $O_{ut1}$ | $O_{ut2}$ |
|---|---|---|---|---|---|---|---|---|---|---|
| State 1 | 1 | 1 | $V_L$ | $V_L$ | $V_{DD}$ | $V_L$ | $V_{DD}$ | $V_L$ | 1 | 1 |
| State 2 | 1 | 0 | $>V_L$ | $<V_H$ | $V_H$ | $>V_L$ | $<V_H$ | $V_L$ | 1 | 0 |
| State 3 | 0 | 1 | $<V_H$ | $>V_L$ | $<V_H$ | $V_L$ | $V_H$ | $>V_L$ | 0 | 1 |
| State 4 | 0 | 0 | $V_H$ | $V_H$ | $V_H$ | GND | $V_H$ | GND | 0 | 0 |

Furthermore, the first and second transmission units 1, 3 and the first and second receiving units 2, 4 provided in the invention include various circuit architecture graphs, wherein any group of transmission units can be selectively coupled to a group of receiving units to form a pair-group bidirectional current-mode transceiver. On the contrary, any group of receiving units can be selectively coupled to a group of receiving units to form a pair-group bidirectional current-mode transceiver.

The so-called transmission unit circuit diagram is a circuit architecture including a group of conversion circuits 10A, 10B, i.e., the first P-type transistors P1A, P1B and the first N-type transistors N1A, N1B as well as multiple first current sources 20A, 20B, i.e., the second P-type transistors P2A, P2B and the second N-type transistors N2A, N2B. The current signals on the transmission line 5 are changed by controlling the conversion circuits 10A, 10B with the input voltage signals. The above-mentioned FIG. 14 has disclosed a first group of transmission units and a first group of receiving units, and the circuit architectures of various transmission units will be illustrated hereinafter.

Figure 16:
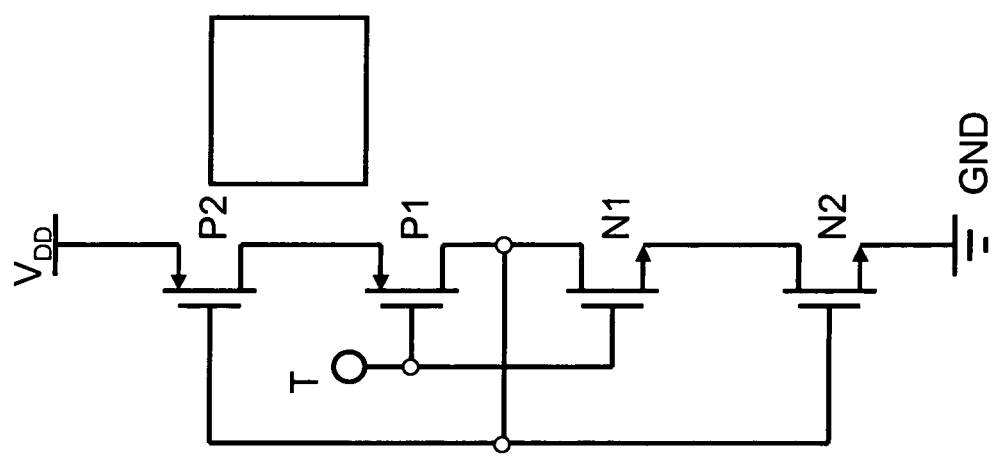
FIG. 16 is the detailed circuit diagram of a second group of transmitters according to the invention.

Referring to FIG. 16, it depicts a detailed circuit diagram of the second group of transmission units disclosed by the invention. Compared with the aforementioned FIG. 14. the operating principle of the transmission units is identical, but the circuit of the transmission unit prevents the bias point of the first current sources 20A, 20B from being cascaded with the first P-type transistors P1A, P1B and the second P-type transistors P2A, P2B by changing the connecting manner of the first current sources 20A, 20B, i.e., changing the bias point mode of the first current sources 20A, 20B, thereby limiting the required supply voltage $V_{DD}$, and achieving operation under a low voltage. However, as the operating principle of the transmission unit is identical with that illustrated in FIG. 14, only the connection relation of the circuit of the second group of transmission units is illustrated in detail.

In the second group of transmission units, the gate, drain, and source of the first P-type transistor P1 are coupled to the gate, drain of the first N-type transistor N1 and the drain of the second P-type transistor P2 respectively. The gate and the source of the second P-type transistor P2 are coupled to the gate of the second N-type transistor N2 and the supply voltage $V_{DD}$ respectively. The source of the first N-type transistor N1 is coupled to the drain of the second N-type transistor N2, while the source of the second N-type transistor N2 is coupled to the ground GND. The point of the gate of the first P-type transistor P1 coupled to the gate of the first N-type transistor N1 is an input end T, for inputting a voltage signal, while the drain of the first P-type transistor P1 is coupled to the gate of the second P-type transistor P2 and the gate of the second N-type transistor N2.

Figure 17:
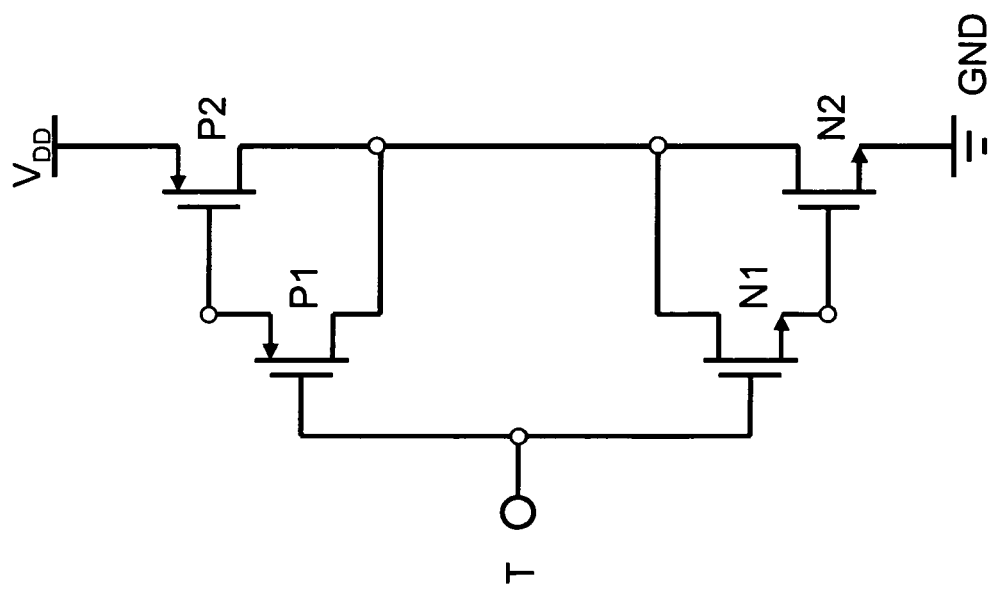
FIG. 17 is the detailed circuit diagram of a third group of transmitters according to the invention.

Referring to FIG. 17, it is a detailed circuit diagram of the third group of transmission units provided in the invention. Compared with the aforementioned FIG. 14, the operating principle of the transmission unit is identical, but the circuit of the group of transmission units changes the coupling manner of the conversion circuits 10A, 10B, for increasing the bias level when the first current sources 20A, 20B are turned on, thereby improving the operating speed of the transmission unit. However, the operating principle of the group of transmission units is identical with that shown in FIG. 14, so only the connection relation of the third group of transmission units will be illustrated in detail.

In the third group of transmission units, the gate and the source of the first P-type transistor P1 are coupled to the gate of the first N-type transistor N1 and the gate of the second P-type transistor P2 respectively. The drain of the first P-type transistor P1 is coupled to the drain of the first N-type transistor N1, the drain of the second P-type transistor P2, and the drain of the second N-type transistor N2. The source of the second P-type transistor P2 is coupled to the supply voltage $V_{DD}$. The source of the first N-type transistor N1 is coupled to the gate of the second N-type transistor N2. The source of the second N-type transistor N2 is coupled to the ground GND. The drain of the second P-type transistor P2 is coupled to the drain of the second N-type transistor N2. The point of the gate of the first P-type transistor coupled to the gate of the first N-type transistor N1 is the input end T.

In the conversion circuits 10A, 10B, the first P-type transistor P1 and the first N-type transistor N1 can be exchanged to couple. At this time, the gate, drain, and source of the second P-type transistor P2 are coupled to the drain and the source of the first N-type N1 transistor and the supply voltage $V_{DD}$ respectively, while the gate, drain, and source of the second N-type transistor N2 are coupled to the drain and source of the first P-type transistor P1 and the ground GND respectively. The source of the first P-type transistor P1, the source of the first N-type transistor N1, the drain of the second P-type transistor P2, and the drain of the second N-type transistor N2 are coupled to each other.

In the design of each aforementioned transmission unit, the parasitic effect on the transmission line 5 and the required driving current should be taken into consideration. As the transmission line 5 has resistance impedance, and the resistance impedance is increased with the prolonging of the transmission line 5, voltage signals can be generated at both ends of the transmission line 5 when the output current signals pass through the resistance impedance. When the transmission line 5 is prolonged to some extent, the voltage swing on the transmission line 5 is increased, such that the input voltage signals cannot be distinguished when the voltage on the transmission line 5 changes in accordance with the state of the input voltage signals.

Therefore, in order to prevent the circumstance that the input voltage signals cannot be distinguished, in the aforementioned various transmission units, the drain of the first P-type transistor P1 and the drain of the first N-type transistor N1 can be coupled to a termination resistor, for reducing the amplitude swing of the voltage signals on the transmission line 5, thereby improving the operating speed of the transmission unit. As such, the original transmission unit can have a faster operating speed with low current, and the small rise and fall delay time can be obtained on the voltage signals of the transmission line 5, i.e., reducing the delay caused by the on/off of the first P-type transistor P1 and the first N-type transistor N1.

Figure 18:
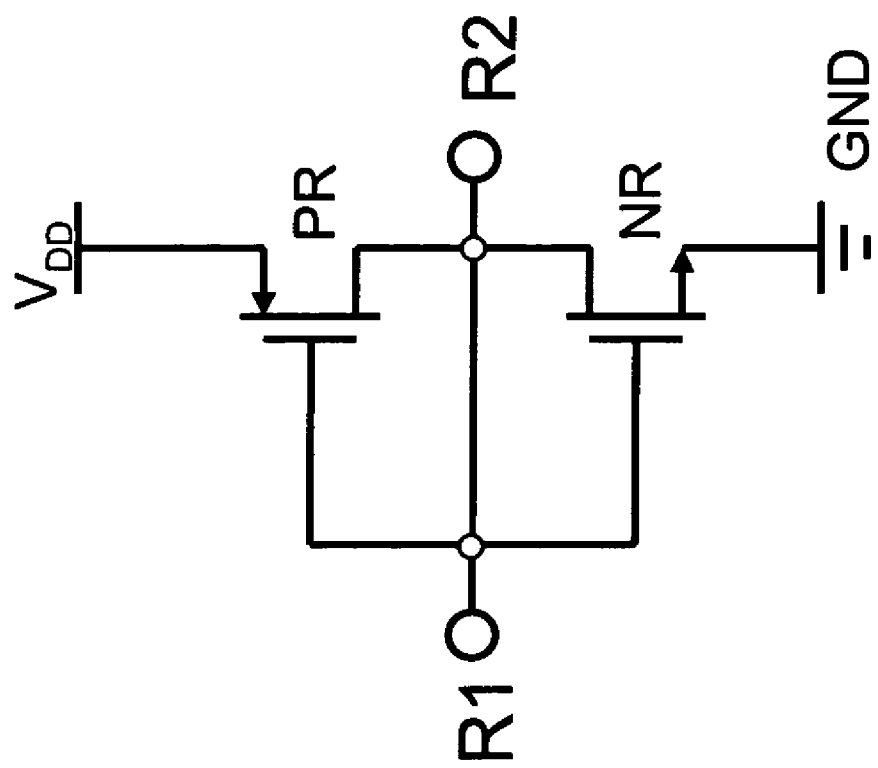
FIG. 18 is the detailed circuit diagram of a conventional termination resistor.

Referring to FIG. 18, it is a detailed circuit diagram of a conventional termination resistor. The gate, drain, and source of the P-type transistor PR are coupled to the gate and the drain of the N-type transistor NR and the supply voltage $V_{DD}$ respectively. The source of the N-type transistor NR is coupled to the ground GND. The coupling point of the gate of the P-type transistor PR and the gate of the N-type transistor NR is coupled to the coupling point of the drain of the P-type transistor PR and the drain of the N-type transistor NR. The point of the gate of the P-type transistor PR coupled to the gate of the N-type transistor NR is the connecting end R1 of the termination resistor. The point of the drain of the P-type transistor PR coupled to the drain of the N-type transistor NR is the other connecting end R2 of the termination resistor.

In the receiving unit, the output current signals generated by the transmission unit are duplicated and reduced into voltage signals. The reverser in the receiving unit can also eliminate noises generated by signal reflection more or less. Moreover, in the receiving unit, a buffer 50A, 50B is coupled to the point of the reverser coupled to the transistor. The above-mentioned FIG. 14 discloses the first group of receiving units according to the invention, and the circuit architectures of various receiving units will be illustrated hereinafter.

Figure 19:
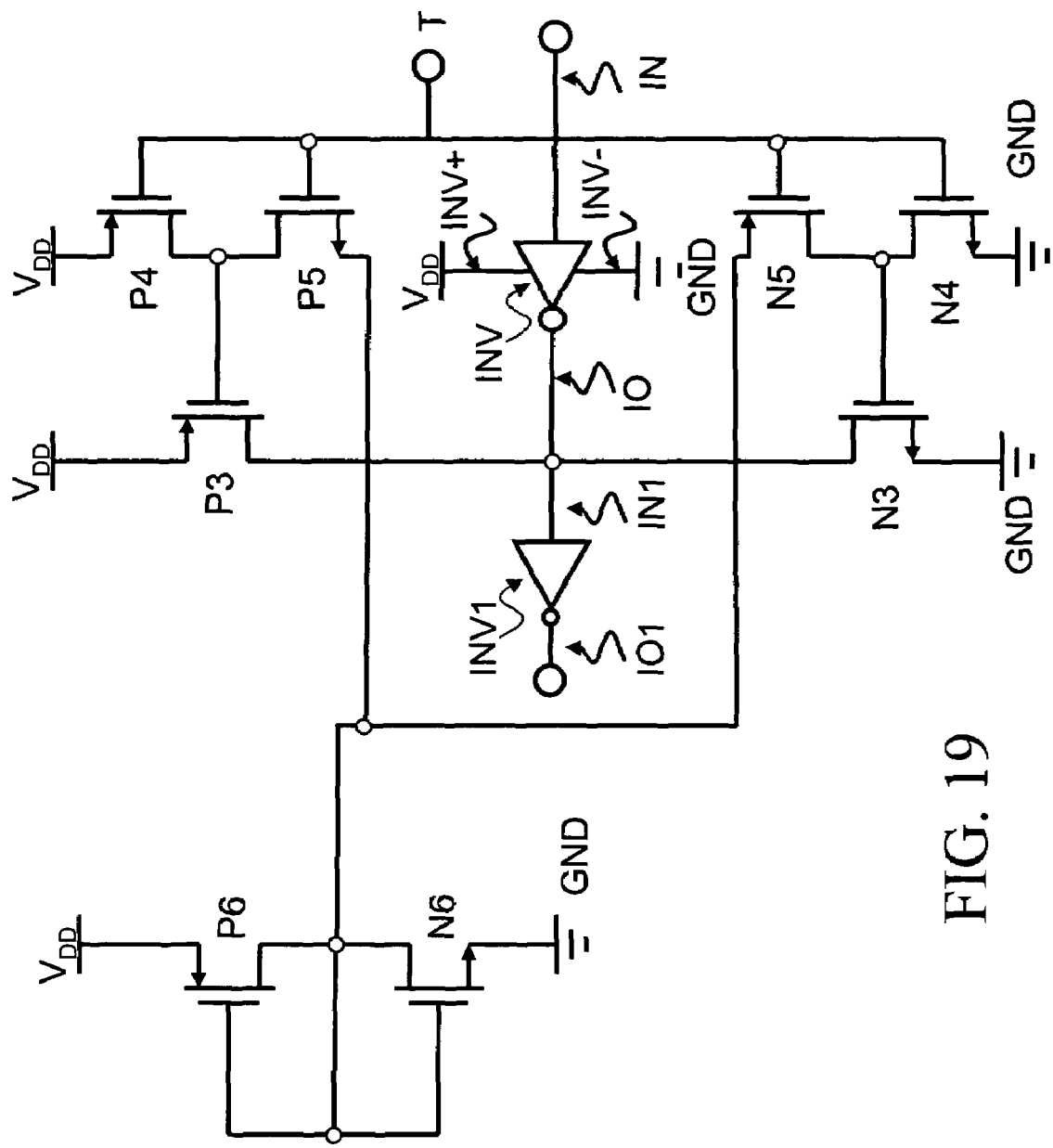
FIG. 19 is the detailed circuit diagram of a second group of receivers according to the invention.

Referring to FIG. 19, it is a detailed circuit diagram of the second group of receiving units provided in the invention. Compared with the above FIG. 14, the operating principle of the group of receiving units is identical, but the group of receiving units is additionally provided with a group of fixed bias circuits to increase the bias range of the second current sources 30A, 30B, besides the control circuits 31A, 31B and the fixed bias circuits are coupled to the input end T. Such a fixed bias circuit includes a fifth N-type transistor N5, a fifth P-type transistor P5, a sixth N-type transistor N6, and a sixth P-type transistor P6. However, the operating principle of the receiving unit circuit is identical to that in FIG. 14, so only the connection relation of the circuit of the second group of receiving units will be illustrated in detail.

In the second group of receiving units, the input end IN of the reverser INV is coupled to the drain of the first P-type transistor P1 and the drain of the first N-type transistor N1 (not shown). The output end IO of the reverser INV is coupled to the drain of the third P-type transistor P3, the drain of the third N-type transistor N3, and the input end IN1 of the reverser INV1. The positive end INV+ and the ground end INV− of the reverser INV are coupled to the supply voltage $V_{DD}$ and the ground end GND respectively. The output end IO1 of the signal reverser INV1 can also be coupled to a buffer (not shown).

The gate of the third P-type transistor P3 is coupled to the drain of the fourth P-type transistor P4 and the drain of the fifth N-type transistor N5, while the source of the third P-type transistor P3 is coupled to the supply voltage $V_{DD}$. The drain of the fourth P-type transistor P4 is coupled to the drain of the fifth N-type transistor N5, and the drain of the third P-type transistor P3 is coupled to the drain of the third N-type transistor N3.

The source of the fourth P-type transistor P4 is coupled to the supply voltage $V_{DD}$. The gate of the fourth P-type transistor P4, the gate of the fourth N-type transistor N4, the gate of the fifth N-type transistor N5, and the gate of the fifth P-type transistor P5 are coupled to each other, for inputting an input voltage T. The source of the fourth N-type transistor N4 is coupled to the ground end GND. The drain of the fourth N-type transistor N4 and the drain of the fifth P-type transistor P5 are coupled to each other, and then coupled to the third N-type transistor N3. The source of the third N-type transistor N3 is coupled to the ground GND.

The source of the fifth N-type transistor N5 and the source of the fifth P-type transistor P5 are coupled to the drain of the sixth P-type transistor P6 and the drain of the sixth N-type transistor N6. The gate, drain, and source of the sixth P-type transistor P6 are coupled to the gate and the drain of the sixth N-type transistor N6 and the supply voltage $V_{DD}$ respectively. The source of the sixth N-type transistor N6 is coupled to the ground GND. The coupling point of the gate of the sixth P-type transistor P6 and the gate of the sixth N-type transistor N6 is coupled to the coupling point of the drain of the sixth P-type transistor P6 and the drain of the sixth N-type transistor N6.

Figure 20:
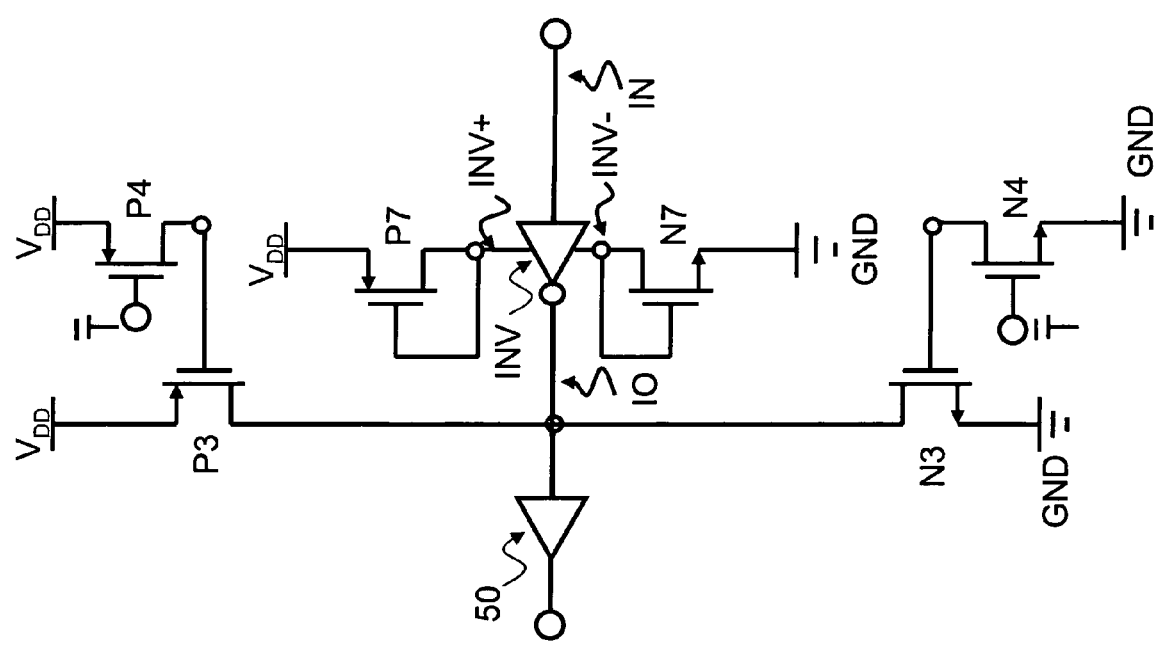
FIG. 20 is the detailed circuit diagram of a third group of receivers according to the invention.

Furthermore, a seventh P-type transistor P7 and a seventh N-type transistor N7 can be added to the circuit architecture of each aforementioned reverser INV or not. For example, referring to FIG. 20, it is a detailed circuit diagram of the third group of receiving units disclosed in the invention. Compared with the above FIG. 14, the operating principle of the group of receiving units is identical, but the circuit diagram of the reverser INV is altered by adding a seventh P-type transistor P7 and a seventh N-type transistor N7, such that the circuit architecture of the reverser INV is similar to the circuit of the transmission unit. The receiving unit reduces the current values of the seventh P-type transistor P7 and the seventh N-type transistor N7 by changing the gate/source voltage $V_{GSP7}$ of the seventh P-type transistor P7 and the gate/source voltage $V_{GSN7}$ of the seventh N-type transistor N7, thereby reducing the infidelity of the current signals mirrored by the second current source. However, the operating principle of the receiving unit is identical with that in FIG. 14, so only the connection relation of the circuit of the third group of receiving units will be illustrated in detail.

In the circuit of the third group of receiving units, the input end IN of the reverser INV is coupled to the point of the drain of the first P-type transistor P1 coupled to the drain of the first N-type transistor N1 (not shown). The output end IO of the reverser INV is coupled to a buffer 50, the drain of the third P-type transistor P3, and the drain of the third N-type transistor N3. The positive end INV+ of the reverser INV is coupled to the drain of the seventh P-type transistor P7. The drain of the seventh P-type transistor P7 is coupled to its gate, while its source is coupled to the supply voltage $V_{DD}$. The ground end INV− of the reverser INV is coupled to the drain of the drain of the seventh N-type transistor N7. The drain and the gate of the seventh N-type transistor N7 are coupled to each other, while its source is coupled to the ground GND.

The gate and the source of the third P-type transistor P3 are respectively coupled to the drain of the fourth P-type transistor P4 and the supply voltage $V_{DD}$. The gate and the source of the third N-type transistor N3 are coupled to the drain of the fourth N-type transistor N4 and the ground GND. The gate of the fourth P-type transistor P4 and the gate of the fourth N-type transistor N4 are coupled to the reversed input voltage signals T. The source of the fourth P-type transistor P4 and the source of the fourth N-type transistor N4 are coupled to the supply voltage $V_{DD}$ and the ground GND respectively.

Figure 21:
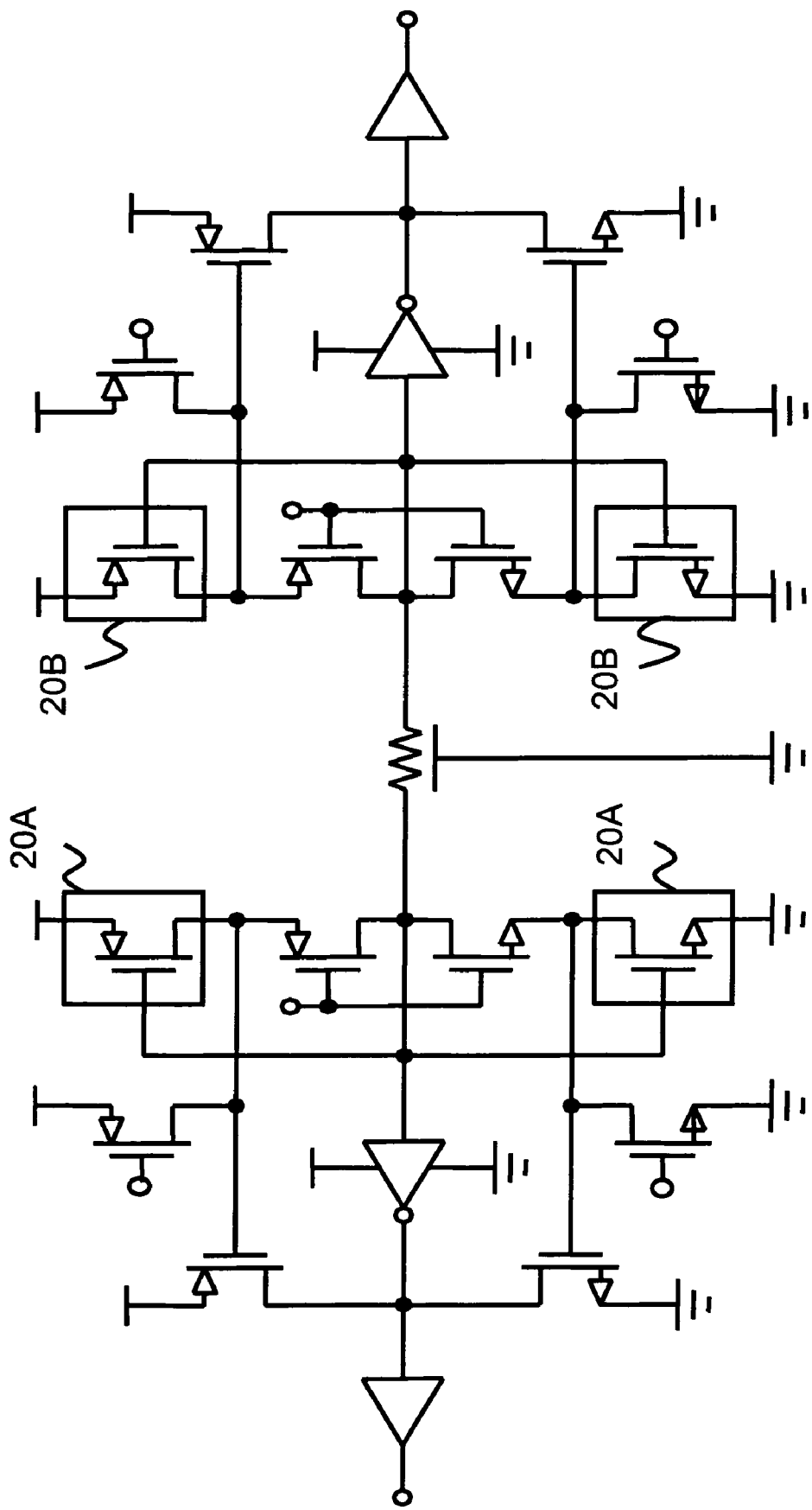
FIG. 21 is the circuit diagram according to the second embodiment of the invention.

For the aforementioned several groups of transmission units and receiving units, any group of transmission units can be selectively coupled to a group of receiving units, thereby forming a pair-group bidirectional current-mode transceiver. On the contrary, any group of receiving units can be selectively coupled to a group of transmission units, thereby forming a pair-group bidirectional current-mode transceiver. For example, referring to FIG. 21, it is a circuit diagram according to the second embodiment of the invention, wherein the bidirectional current-mode transceiver is constituted by a second group of transmission units and a first group of receiving units.

In the transmission unit, through changing the connecting mode of the first current sources 20A, 20B, i.e., changing the bias point mode of the first current sources 20A, 20B, the bias point of the first current sources 20A, 20B will not be cascaded with transistors, eliminating limitation to the output current. Therefore, compared with FIG. 14, the architecture has a faster transmission rate, and is applicable to operate under low voltage.

Figure 22:
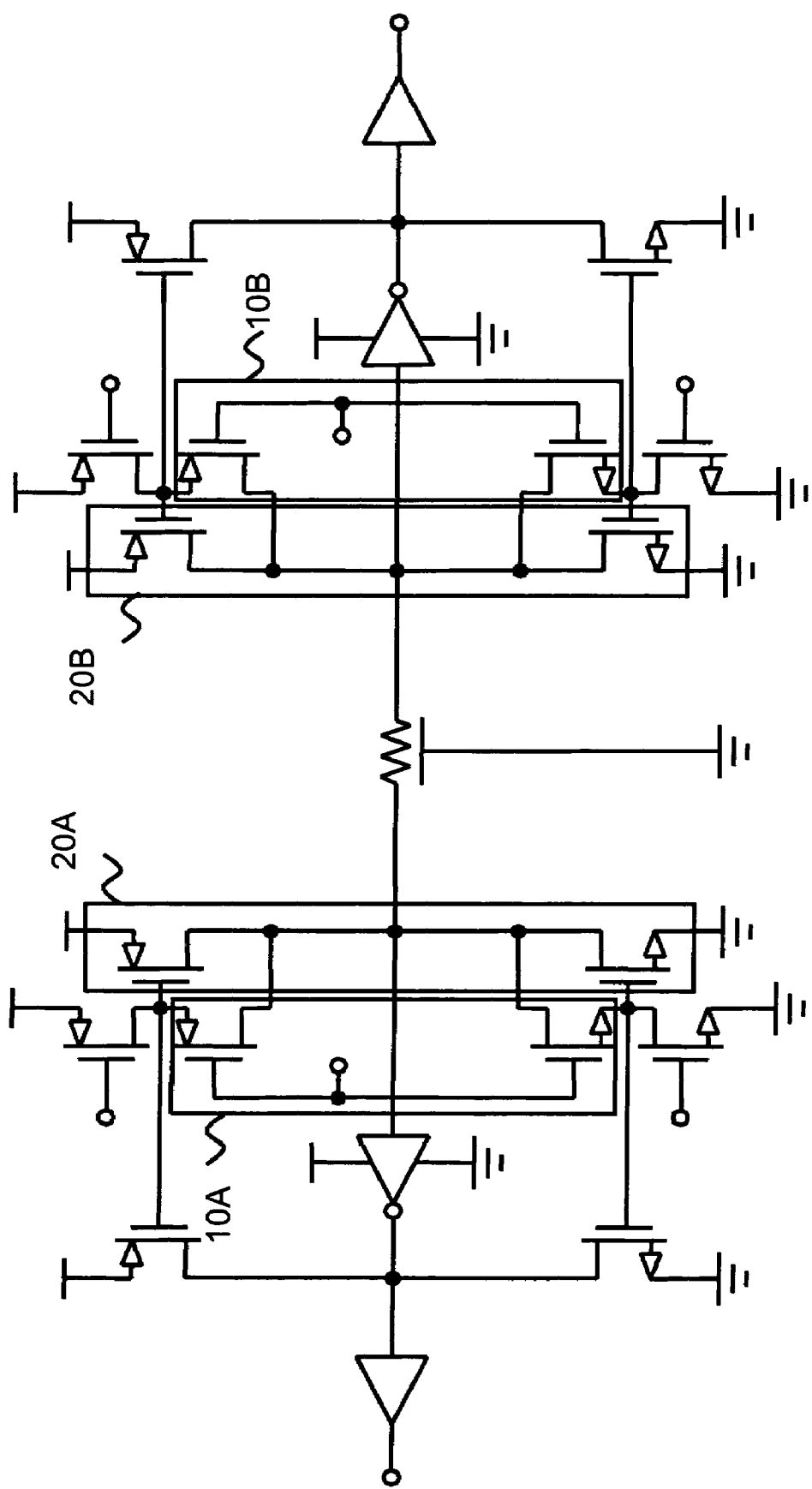
FIG. 22 is the circuit diagram according to the third embodiment of the invention.

Referring to FIG. 22, it is a circuit diagram according to the third embodiment of the invention, wherein the bidirectional current-mode transceiver is constituted by a third group of transmission units and a first group of receiving units. In the transmission unit, the coupling manner of the conversion circuits 10A, 10B is changed to increase the bias level of the first current sources 20A, 20B, i.e., obtaining a greater driving current, thereby improving the operating speed of the transmission unit. Moreover, the coupling manner of the conversion circuits and the first current sources is applicable under a lower supply voltage $V_{DD}$.

Figure 23:
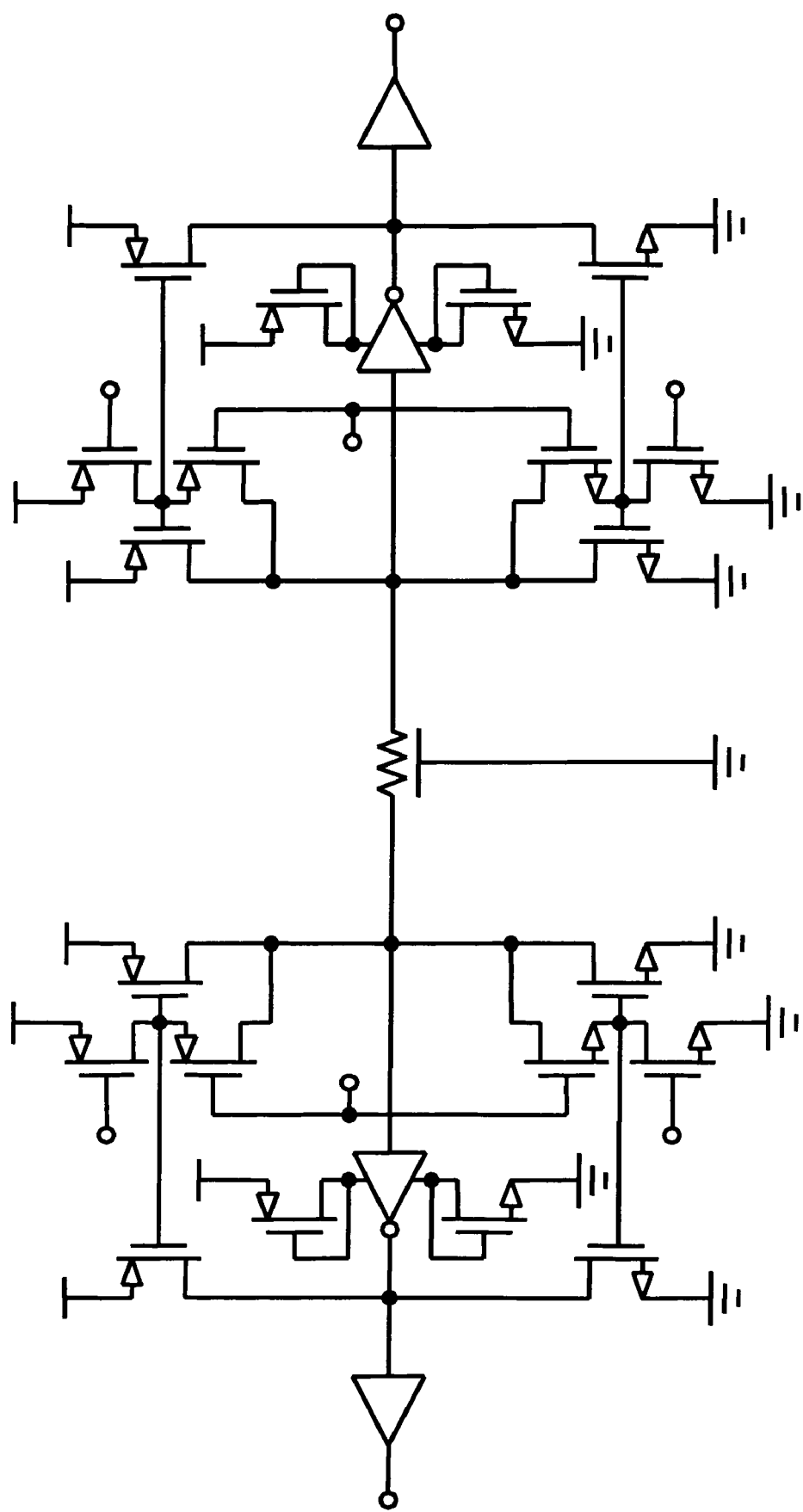
FIG. 23 is the circuit diagram according to the fourth embodiment of the invention.

Referring to FIG. 23, it is a circuit diagram according to the fourth embodiment of the invention, wherein the bidirectional current-mode transceiver is constituted by a third group of transmission units and a third group of receiving units. For the transceiver, the circuit diagram of the receiving unit is similar to the circuit diagram of the transmission unit, for reducing the reflection-interfering noises caused by the transmission unit.

Figure 24:
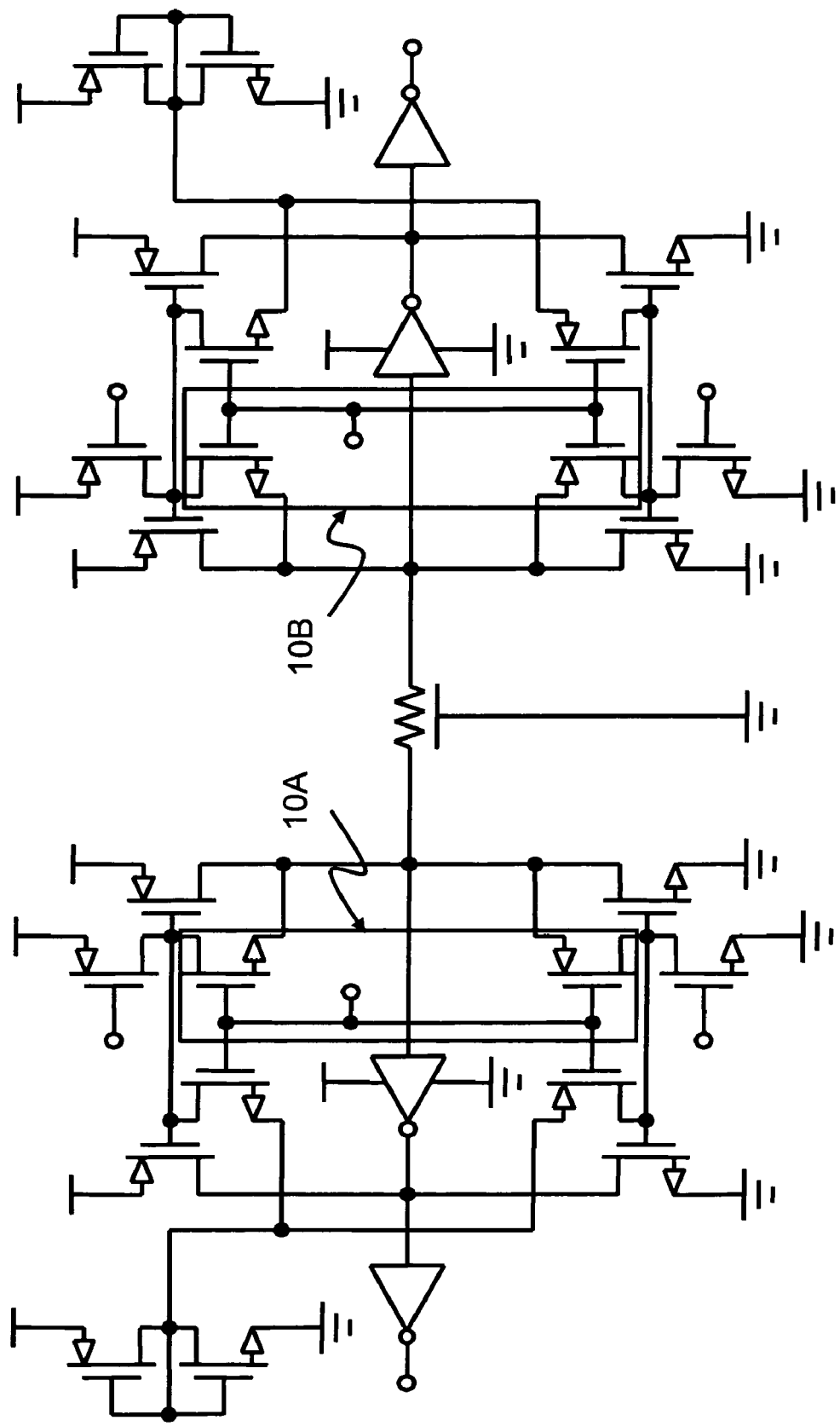
FIG. 24 is the circuit diagram according to the fifth embodiment of the invention.
Figure 25:
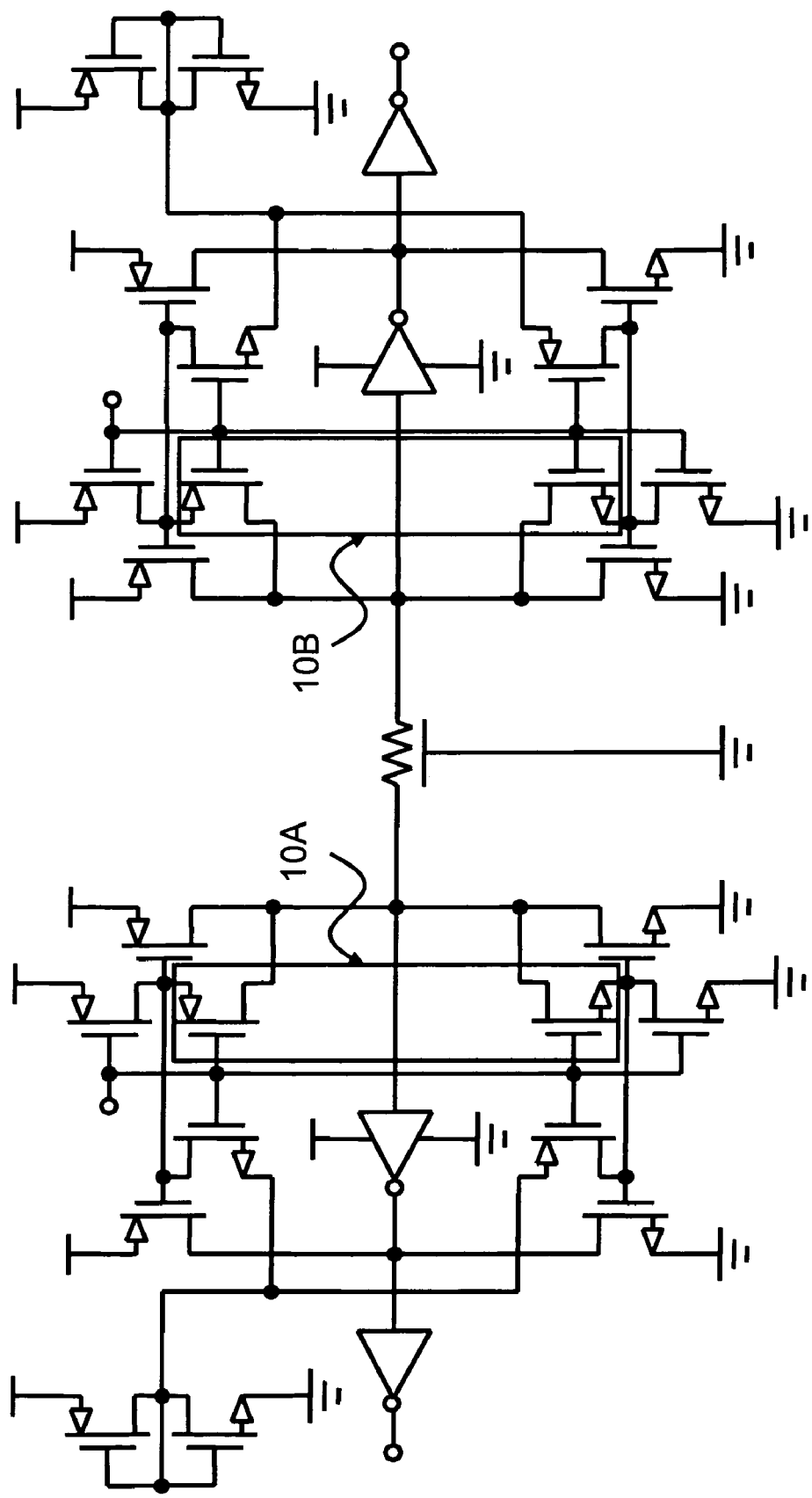
FIG. 25 is the circuit diagram according to the sixth embodiment of the invention.

Referring to FIGS. 24 and 25, the circuit diagrams according to the fifth and the sixth embodiments of the invention are illustrated respectively, wherein the bidirectional current-mode transceivers are both constituted by a third group of transmission units and a second group of receiving units. The difference between the two embodiments lies in the change of the transistor configuration of the conversion circuits 10A, 10B, i.e., replacing the P-type transistors by N-type transistors, and replacing the N-type transistors by P-type transistors in the conversion circuits 10A, 10B in FIG. 25. Therefore, if the transmission line 5 is long, the charging speed of P-type transistors is faster than the N-type transistors when charging; and the discharging speed of the N-type transistors is faster than the P-type transistors when discharging. Therefore, the circuit operating speed in FIG. 25 is faster than that in FIG. 24.

Figure 26:
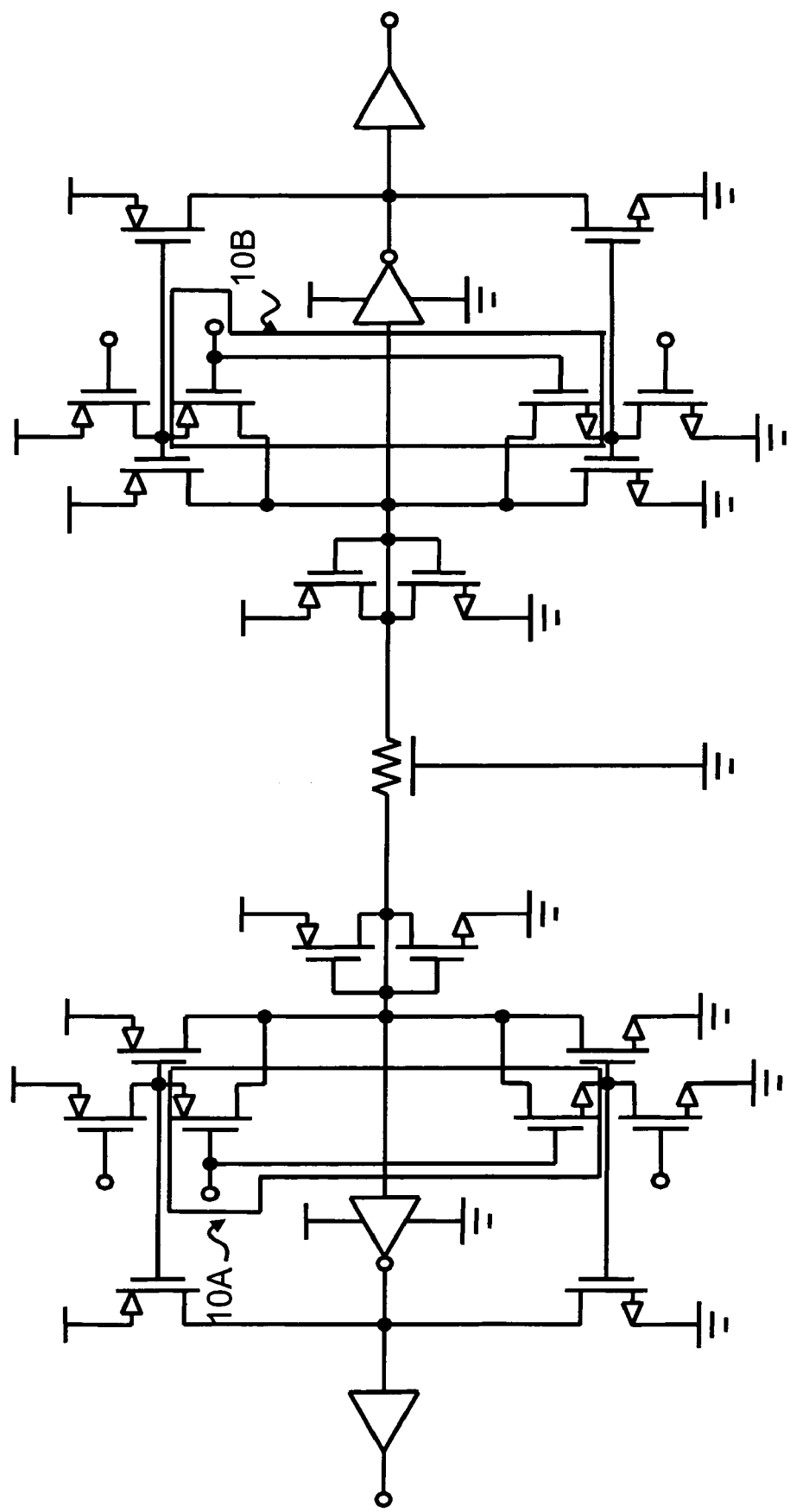
FIG. 26 is the circuit diagram according to the seventh embodiment of the invention.
Figure 27:
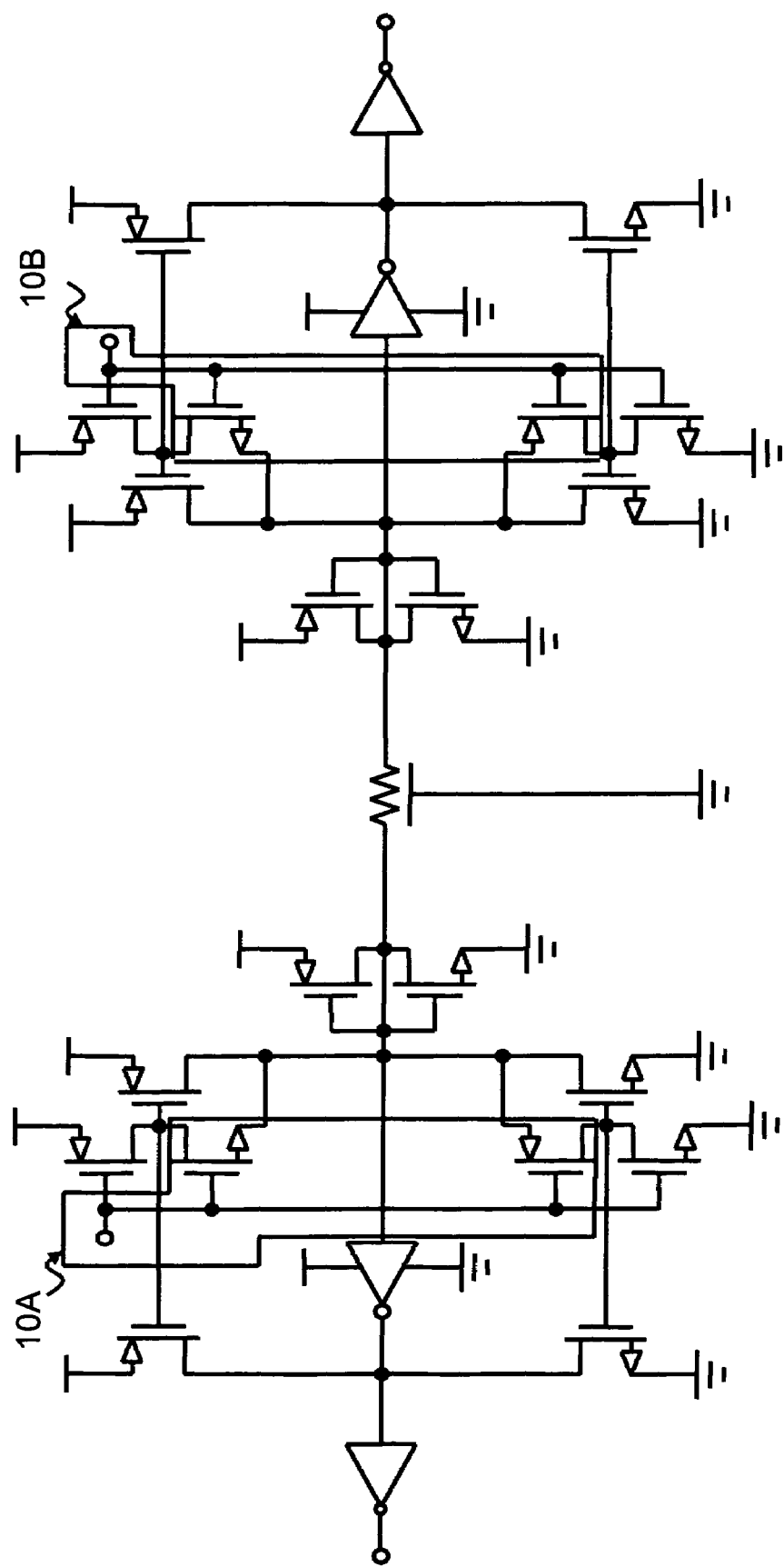
FIG. 27 is the circuit diagram according to the eighth embodiment of the invention.

Referring to FIGS. 26 and 27, the circuit diagrams according to the seventh and the eighth embodiments of the invention are illustrated, wherein the bidirectional current-mode transceivers are both constituted by a third group of transmission units and a first group of receiving units. Besides, a termination resistor is added in the conversion circuit of the third group of transmission units, for reducing the amplitude swing of the voltage signals on the transmission line, thereby increasing the operating speed of the transmission unit. The difference of the two embodiments lies in the change of the transistor configuration of the conversion circuits 10A, 10B, i.e., replacing the P-type transistors by N-type transistors and replacing the N-type transistors by P-type transistors in the conversion circuits 10A, 10B as shown in FIG. 27. Moreover, the output end of the reverser is coupled to another reverser.

The invention being thus described, it will be obvious that the same may be varied in many ways. Such variations. are not to be regarded as a departure from the spirit and scope of the invention, and all such modifications as would be obvious to one skilled in the art are intended to be included within the scope of the following claims.

What is claimed is:

1. A bidirectional current-mode transceiver, comprising:
   two transmission units, wherein each of the transmission units comprises:
   a conversion circuit, for converting an input voltage into an output current; and
   a plurality of first current sources, for transmitting the output current;
   a transmission line, coupled to the transmission units; and
   two receiving units, respectively forming a pair group with the transmission units, wherein each of the receiving units comprises:
   a plurality of second current sources, for mirroring the output current; and
   a reverser, for generating an output voltage according to the output current.

2. The bidirectional current-mode transceiver according to claim 1, further comprising a buffer for receiving and outputting the output voltage.

3. The bidirectional current-mode transceiver according to claim 1, further comprising a termination resistor circuit, connected to the conversion circuit, for reducing a voltage swing on the transmission line.

4. The bidirectional current-mode transceiver according to claim 1, wherein the conversion circuit comprises:
   a first P-type transistor; and
   a first N-type transistor, wherein the gate of the first N-type transistor is coupled to the gate of the first P-type transistor, and the drain of the first N-type transistor is coupled to the drain of the first P-type transistor.

5. The bidirectional current-mode transceiver according to claim 4, wherein the point of the gate of the first P-type transistor coupled to the gate of the first N-type transistor is an input end, for inputting the input voltage.

6. The bidirectional current-mode transceiver according to claim 5, wherein the first P-type transistor is coupled to a second P-type transistor; the first N-type transistor is coupled to a second N-type transistor; the gate of the second P-type transistor is coupled to the source of the first P-type transistor; the gate of the second N-type transistor is coupled to the source of the first N-type transistor; the source of the second P-type transistor and the source of the second N-type transistor are respectively coupled to the supply voltage and the ground.

7. The bidirectional current-mode transceiver according to claim 6, wherein the drain of the first P-type transistor, the drain of the first N-type transistor, the drain of the second P-type transistor, and the drain of the second N-type transistor are coupled to each other.

8. The bidirectional current-mode transceiver according to claim 5, wherein the first N-type transistor is coupled to a second P-type transistor; the first P-type transistor is coupled to a second N-type transistor; the drain of the second P-type transistor is coupled to the source of the first N-type transistor; and the drain of the second N-type transistor is coupled to the source of the first P-type transistor.

9. The bidirectional current-mode transceiver according to claim 8, wherein the gate of the second P-type transistor is coupled to the drain of the first N-type transistor; the gate of the second N-type transistor is coupled to the drain of the first P-type transistor; the source of the second P-type transistor and the source of the second N-type transistor are respectively coupled to the supply voltage and the ground.

10. The bidirectional current-mode transceiver according to claim 9, wherein the source of the first P-type transistor, the source of the first N-type transistor, the drain of the second P-type transistor, and the drain of the second N-type transistor are coupled to each other.

11. The bidirectional current-mode transceiver according to claim 4, wherein the first current sources comprise:
    a second P-type transistor, wherein the drain of the second P-type transistor is coupled to the source of the first P-type transistor; and
    a second N-type transistor, wherein the drain of the second N-type transistor is coupled to the source of the first N-type transistor.

12. The bidirectional current-mode transceiver according to claim 11, wherein the gate of the second P-type transistor is coupled to the drain; the gate of the second N-type transistor is coupled to the drain; the source of the second P-type transistor and the source of the second N-type transistor are respectively coupled to a supply voltage and a ground.

13. The bidirectional current-mode transceiver according to claim 11, wherein the gate of the second P-type transistor is coupled to the drain of the first P-type transistor, the drain of the first N-type transistor, and the gate of the second N-type transistor; and the source of the second N-type transistor and the source of the second P-type transistor are respectively coupled to the ground and the supply voltage.

14. The bidirectional current-mode transceiver according to claim 1, wherein the second current sources comprise:
    a third P-type transistor; and
    a third N-type transistor, with the drain coupled to the drain of the third P-type transistor;
    wherein, the source of the third P-type transistor and the source of the third N-type transistor are respectively coupled to a supply voltage and a ground.

15. The bidirectional current-mode transceiver according to claim 14, wherein the reverser comprises:
    an input end, coupled to the drain of a first P-type transistor and the drain of a first N-type transistor;
    an output end, coupled to the drain of the third N-type transistor and the drain of the third P-type transistor;
    a positive end; and
    a ground.

16. The bidirectional current-mode transceiver according to claim 15, wherein the positive end of the reverser is coupled to the supply voltage, and the ground end of the reverser is coupled to the ground.

17. The bidirectional current-mode transceiver according to claim 15, wherein the reverser further comprises:
- a seventh P-type transistor, with the gate coupled to the positive end of the reverser, and with the source coupled to the supply voltage, wherein the gate and the drain of the seventh P-type transistor are coupled to each other; and
- a seventh N-type transistor, with the gate coupled to the ground end of the reverser, and with the source coupled to the ground, wherein the gate and the drain of the seventh N-type transistor are coupled to each other.

18. The bidirectional current-mode transceiver according to claim 15, wherein the receiving unit further comprises a control circuit, the control circuit further comprising:
- a fourth P-type transistor, with the drain coupled to the gate of the third P-type transistor, and with the source coupled to the supply voltage; and
- a fourth N-type transistor, with the drain coupled to the gate of the third N-type transistor, and with the source coupled to the ground.

19. The bidirectional current-mode transceiver according to claim 18, wherein the gate of the fourth N-type transistor is coupled to the gate of the fourth P-type transistor, and coupled to a reversed input voltage signal.

20. The bidirectional current-mode transceiver according to claim 18, wherein the gate of the fourth N-type transistor is coupled to the gate of the fourth P-type transistor, and coupled to an input voltage signal.

21. The bidirectional current-mode transceiver according to claim 20, wherein the receiving unit further comprises a fixed bias circuit, the fixed bias circuit further comprising:
- a fifth N-type transistor, with the drain coupled to the drain of the fourth P-type transistor;
- a fifth P-type transistor, with the drain coupled to the drain of the fourth N-type transistor, and with the source coupled to the source of the fifth N-type transistor;
- a sixth N-type transistor, the drain of the sixth N-type transistor coupled to the gate; the drain of the sixth N-type transistor coupled to the source of the fifth P-type transistor and the source of the fifth N-type transistor; the source of the sixth N-type transistor coupled to the ground; and
- a sixth P-type transistor, the drain of the sixth P-type transistor coupled to the gate; the drain of the sixth P-type transistor coupled to the drain of the sixth N-type transistor; the source of the sixth P-type transistor coupled to the supply voltage;

wherein, the gate of the fourth P-type transistor, the gate of the fourth N-type transistor, the gate of the fifth P-type transistor, and the gate of the fifth N-type transistor are coupled to each other.

22. The bidirectional current-mode transceiver according to claim 15, wherein the output end of the reverser is coupled to an input end of a signal reverser.

23. The bidirectional current-mode transceiver according to claim 22, wherein an output end of the signal reverser is used to output the output voltage.

* * * * *